(12) United States Patent
Kwak

(10) Patent No.: US 11,882,753 B2
(45) Date of Patent: Jan. 23, 2024

(54) DISPLAY PANEL, DISPLAY DEVICE INCLUDING THE PANEL, AND METHOD FOR MANUFACTURING THE PANEL

(71) Applicant: LG Display Co., Ltd., Seoul (KR)

(72) Inventor: Changhwan Kwak, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 228 days.

(21) Appl. No.: 17/409,199

(22) Filed: Aug. 23, 2021

(65) Prior Publication Data
US 2022/0208896 A1     Jun. 30, 2022

(30) Foreign Application Priority Data
Dec. 24, 2020 (KR) .......................... 10-2020-0183099

(51) Int. Cl.
| | |
|---|---|
| *H01L 27/32* | (2006.01) |
| *H01L 51/56* | (2006.01) |
| *H01L 51/50* | (2006.01) |
| *H10K 59/65* | (2023.01) |
| *H10K 50/15* | (2023.01) |
| *H10K 50/16* | (2023.01) |
| *H10K 59/35* | (2023.01) |
| *H10K 71/00* | (2023.01) |
| *H10K 59/12* | (2023.01) |

(Continued)

(52) U.S. Cl.
CPC .............. *H10K 59/65* (2023.02); *H10K 50/15* (2023.02); *H10K 50/16* (2023.02); *H10K 50/19* (2023.02); *H10K 50/852* (2023.02); *H10K 59/1201* (2023.02); *H10K 59/353* (2023.02); *H10K 59/60* (2023.02); *H10K 71/00* (2023.02); *G09G 2320/0233* (2013.01); *H10K 59/352* (2023.02); *H10K 2102/351* (2023.02)

(58) Field of Classification Search
CPC ......... H10K 59/35–353; H10K 59/876; H10K 50/852; H10K 50/19; H01L 27/3211; H01L 27/3213; H01L 27/3216; H01L 27/3218
See application file for complete search history.

(56) References Cited

U.S. PATENT DOCUMENTS

| | | | |
|---|---|---|---|
| 10,615,235 B2 | 4/2020 | Heo | |
| 2005/0242712 A1* | 11/2005 | Sung | ...................... H10K 59/35 313/506 |

(Continued)

*Primary Examiner* — Victoria K. Hall
(74) *Attorney, Agent, or Firm* — Birch, Stewart, Kolasch & Birch, LLP

(57) ABSTRACT

A display panel, a display device and a method for manufacturing a display panel are discussed. The display panel includes a display area, wherein a portion of the display area is a light sensing area that overlaps an optical sensor, and a remaining portion is a general area that does not overlap the optical sensor. The display area includes a plurality of sub-pixel areas disposed in the general area and the light sensing area, and a plurality of transmissive pixel areas disposed in a light sensing area, wherein the panel includes a general light-emissive element corresponding to the sub-pixel area of the general area and including a main light-emissive layer between first and second electrodes, and a multi light-emissive element corresponding to the sub-pixel area of the light sensing area and including a main light-emissive layer and an auxiliary light-emissive layer disposed between the first and second electrodes.

20 Claims, 25 Drawing Sheets

(51) Int. Cl.
    *H10K 50/19*     (2023.01)
    *H10K 50/852*     (2023.01)
    *H10K 59/60*     (2023.01)
    *H10K 102/00*     (2023.01)

(56) References Cited

U.S. PATENT DOCUMENTS

| | | | |
|---|---|---|---|
| 2013/0147858 A1 | 6/2013 | Omoto | |
| 2016/0293676 A1* | 10/2016 | Komatsu | H10K 59/351 |
| 2017/0125494 A1* | 5/2017 | Matsusue | H10K 59/38 |
| 2017/0222173 A1* | 8/2017 | Matsusue | H10K 50/828 |
| 2019/0148676 A1* | 5/2019 | Morimoto | H10K 50/16 |
| | | | 257/40 |
| 2020/0227687 A1* | 7/2020 | Ge | H10K 50/13 |
| 2020/0273916 A1* | 8/2020 | Jiao | H10K 71/00 |
| 2021/0057494 A1* | 2/2021 | Chung | H10K 50/818 |
| 2022/0020953 A1* | 1/2022 | Huang | H10K 50/828 |
| 2022/0190246 A1* | 6/2022 | Ishisone | H05B 33/12 |

\* cited by examiner

Prior Art

DISPLAY PANEL, DISPLAY DEVICE INCLUDING THE PANEL, AND METHOD FOR MANUFACTURING THE PANEL

CROSS-REFERENCE TO RELATED APPLICATION

This application claims priority to and the benefit of Korean Patent Application No. 10-2020-0183099, filed in the Republic of Korea on Dec. 24, 2020, the entire contents of which are expressly incorporated herein by reference into the present application.

BACKGROUND

Field

The present disclosure relates to a display device including an optical sensor, a display panel provided therein, and a method for manufacturing the display panel.

Description of Related Art

As the information society develops, various portable smart devices such as notebooks, tablet PCs, smart phones and smart watches are widely used. In general, these portable devices have not only an image display function, but also have a data generation function in various ways. To this end, the portable device can include an optical sensor that detects light. In one example, the optical sensor can include a CCD (Charge Coupled Device), a camera, or an infrared sensor.

A display panel includes a signal line or an electrode pattern made of a light-shielding material. Thus, in order to prevent light directed to the optical sensor from being reflected from or absorbed by the display panel, an optical sensor can be disposed above the display panel in a direction in which light is emitted from the display panel. In this case, a bezel width of the display panel can increase due to an area where the optical sensor is disposed, or the image display function may not be performed well because a partial area of a display area of the display panel overlapping the optical sensor is screened with the optical sensor.

To address those issues, a structure is proposed in which the optical sensor is disposed under the display panel, and in order to transmit light to the optical sensor disposed under the display panel, a pixel area for displaying an image and a pixel area for transmitting light therethrough are arranged in a mixed manner in a "light sensing area" as a partial area of the display panel overlapping with the optical sensor.

In this case, there are advantages that the bezel width of the display panel due to the arrangement of the optical sensor may not increase, and the image can be displayed in the entire display area regardless of the arrangement of the optical sensor.

SUMMARY OF THE INVENTION

Conventionally, the light sensing area of a display area overlapping with an optical sensor includes a transmissive pixel area for transmission of light to the optical sensor, and thus, has a resolution lower than that in a remaining area of the display area excluding the light sensing area, for example, a general area not overlapping with the optical sensor. Accordingly, there is a limitation in that the light sensing area and the general area can be visually recognized in a different manner from each other.

To reduce a difference between luminances in the light sensing area and the general area due to the difference between the resolutions in the light sensing area and the general area, a light-emissive element in the light sensing area can operate at higher luminance than a light-emissive element in the general area may. In this case, due to the high luminance operation, a lifespan of the light-emissive element in the light sensing area may be greatly smaller than a lifespan of the light-emissive element in the general area.

Accordingly, a purpose of the present disclosure is to provide a display panel in which the lifespan of the light-emissive element in the light sensing area can be substantially equal to that of the light-emissive element in the general area while preventing or minimizing the difference between luminances in the light sensing area and the general area, and to provide a display device including the panel, and a method for manufacturing the panel.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

An example according to the present disclosure provides a display panel including a display area in which an image is displayed, wherein a portion of the display area is a light sensing area that overlaps an optical sensor, and a remaining portion is a general area that does not overlap the optical sensor. The display area includes a plurality of sub-pixel areas disposed in the general area and the light sensing area, and a plurality of transmissive pixel areas disposed in a light sensing area, wherein the panel includes a general light-emissive element corresponding to the sub-pixel area of the general area and including a main light-emissive layer between first and second electrodes of the general light-emissive element, and a multi light-emissive element corresponding to the sub-pixel area of the light sensing area and including a main light-emissive layer and an auxiliary light-emissive layer disposed between first and second electrodes of the multi light-emissive element.

According to the present disclosure, the light sensing area overlapping the optical sensor includes the plurality of sub-pixel areas and the plurality of transmissive pixel areas alternately arranged with the plurality of sub-pixel areas. Thus, the light sensing area can transmit light to be directed to the optical sensor therethrough, while emitting light to display an image. As a result, the image can be displayed over an entire display area.

According to the present disclosure, while the general light-emissive element in the general area has a single stack structure including only the main light-emissive layer, the multi light-emissive element in the light sensing area has a multi stack structure including the main light-emissive layer and the auxiliary light-emissive layer. Therefore, at a predefined current density, the multi light-emissive element in the light sensing area can emit light at higher luminance than the general light-emissive element in the general area may.

Accordingly, in the present disclosure, there is an advantage in that a difference between luminances of the light sensing area and the general area due to a difference between resolutions of the light sensing area and the general area can be reduced.

In addition, in the present disclosure, there is an advantage that a lifespan of the multi light-emissive element in the light sensing area can be substantially equal to that of the general light-emissive element in the general area.

According to the present disclosure, the general light-emissive element can further include a thickness adjustment layer. Due to this thickness adjustment layer, a difference between thicknesses of the general light-emissive element having a single stack structure and the multi light-emissive element having a multi stack structure can be reduced. Accordingly, even when the general light-emissive element and the multi light-emissive element are formed in different structures, both can have substantially the same microcavity effect.

The display panel according to an embodiment of the present disclosure includes the general light-emissive element corresponding to each sub-pixel area in the general area not overlapping the optical sensor, and the multi light-emissive element corresponding to each sub-pixel in the light sensing area overlapping the optical sensor. In this connection, the general light-emissive element has a single stack structure including only the main light-emissive layer, while the multi light-emissive element has a multi stack structure that further includes the auxiliary light-emissive layer in addition to the main light-emissive layer.

According to the present disclosure, the multi light-emissive element can emit light at higher luminance than the general light-emissive elements can emit at a predefined current density.

Due to the multi light-emissive element, the difference between luminances of the light sensing area and the general area due to the difference between resolutions of the light sensing area and the general area can be reduced. Thus, the light sensing area and the general area can be prevented from being recognized in a different manner from each other.

In addition, according to the present disclosure, while each sub-pixel area of the light sensing area can emit light at higher luminance than each sub-pixel area of the general area may, the lifespan of the multi light-emissive element can be substantially equal to that of the general light-emissive element.

Examples of the present disclosure further provide a display device comprising the display panel as described above, a portable smart device comprising the display device and a method for manufacturing a display panel.

Effects and advantages of the present disclosure are not limited to the above-mentioned effects and advantages, and other effects and advantages as not mentioned will be clearly understood by those skilled in the art from following descriptions.

BRIEF DESCRIPTION OF DRAWINGS

The present invention will become more fully understood from the detailed description given hereinbelow and the accompanying drawings which are given by way of illustration only, and thus are not limitative of the present invention.

DETAILED DESCRIPTIONS OF THE EMBODIMENTS

Figure 1:
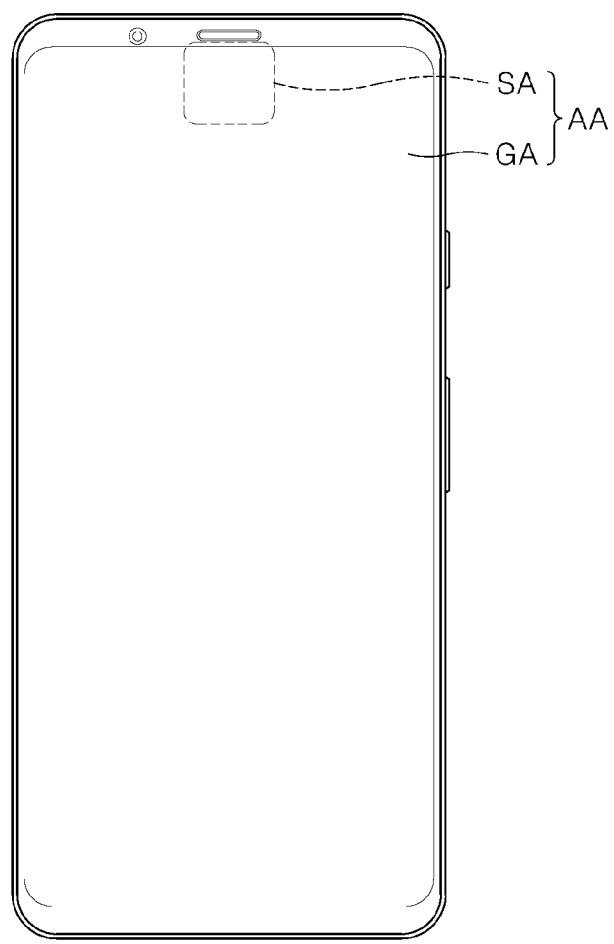
FIG. 1 is an example of a front face of a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device and a method for manufacturing the display device according to one or more embodiments of the present disclosure will be described with reference to the accompanying drawings. All components of each display device according to all embodiments of the present disclosure are operatively coupled and configured.

First, a display device according to an embodiment of the present disclosure will be described with reference to FIG. 1, FIG. 2, and FIG. 3.

FIG. 1 is an example of a front face of a display device according to an embodiment of the present disclosure. FIG. 2 is a diagram showing a display device according to an embodiment of the present disclosure. FIG. 3 is an example of an equivalent circuit corresponding to one sub-pixel area of a display area of FIG. 2.

As shown in FIG. 1, a display device 10 according to an embodiment of the present disclosure can be included in a portable device such as a smart watch, a smart phone, and a tablet PC. The display device 10 includes a display panel including a display area AA (active area) having an image display function, and an optical sensor having an imaging function.

The display panel can be disposed on a front face of display device 10.

Further, the optical sensor refers to an optical device that is disposed under the display panel and detects light which has transmitted through the display panel.

The optical sensor can include an optical device that generates an electric signal corresponding to an amount of light reflected from a target object. In one example, the optical sensor can include one of a camera, a CCD (Charge Coupled Device), and an infrared sensor.

Hereinafter, for easy description, it is assumed that the optical sensor is a camera that generates a digital image signal of an object disposed in front of the display device 10.

A portion SA of the display area AA of the display panel overlaps the optical sensor disposed under the display panel.

For example, the portion of the display area AA is a light sensing area SA overlapping the optical sensor. A remaining area of the display area AA except for the light sensing area SA is a general area GA which does not overlap with the optical sensor.

The display area AA of the display panel includes a plurality of sub-pixel areas (SPA in FIG. 2) that are disposed in the general area GA and the light sensing area SA to emit light for displaying an image, and a plurality of transmissive pixel areas (TPA in FIG. 7, and TPA' in FIG. 8) which are disposed in the light sensing area SA and are alternately arranged with the sub-pixel area SPA in the light sensing area SA and transmit light therethrough.

For example, in the light sensing area SA, at least one sub-pixel area SPA and at least one transmissive pixel area TPA are alternately arranged with each other in each direction.

The light sensing area SA can implement an image display function, and can transmit light to be directed to the optical sensor therethrough.

As the light sensing area SA includes the transmissive pixel area, the sub-pixel area SPA in the light sensing area SA has a lower resolution than that of the sub-pixel area SPA in the general area GA. Due to this difference in the resolution, the light sensing area SA and the general area GA can be perceived in a different manner to each other.

To prevent this defect, according to an embodiment of the present disclosure, a light-emissive element corresponding to each sub-pixel area SPA in the light sensing area SA emits light at higher luminance than a light-emissive element corresponding to each sub-pixel area SPA in the general area GA emits.

A lifespan of the light-emissive element can be reduced based on a driving time and a driving intensity thereof. Therefore, when the light-emissive element in the light sensing area SA receives a relatively high drive current to display light at the higher luminance than a luminance of the light-emissive element in the general area GA, the lifespan of the light-emissive element in the light sensing area SA can be drastically lowered than that of the light-emissive element in the general area GA.

To prevent this problem or to address this issue, according to an embodiment of the present disclosure, the light-emissive element in the light sensing area SA has a multi-stack structure including a plurality of light-emissive layers, which is not the case for the light-emissive element in the general area GA.

As described above, the luminance of light emitted from the light-emissive element in the light sensing area SA based on a drive current of a predetermined magnitude can be higher than that of the light-emissive element in the general area GA. Accordingly, the light-emissive element in the light sensing area SA can have a lifespan substantially equal to that of the light-emissive element in the general area GA while emitting light of higher luminance than that of the light-emissive element in the general area GA.

Hereinafter, the light-emissive elements respectively disposed in the general area GA and the light sensing area SA will be described in more detail.

Figure 2:
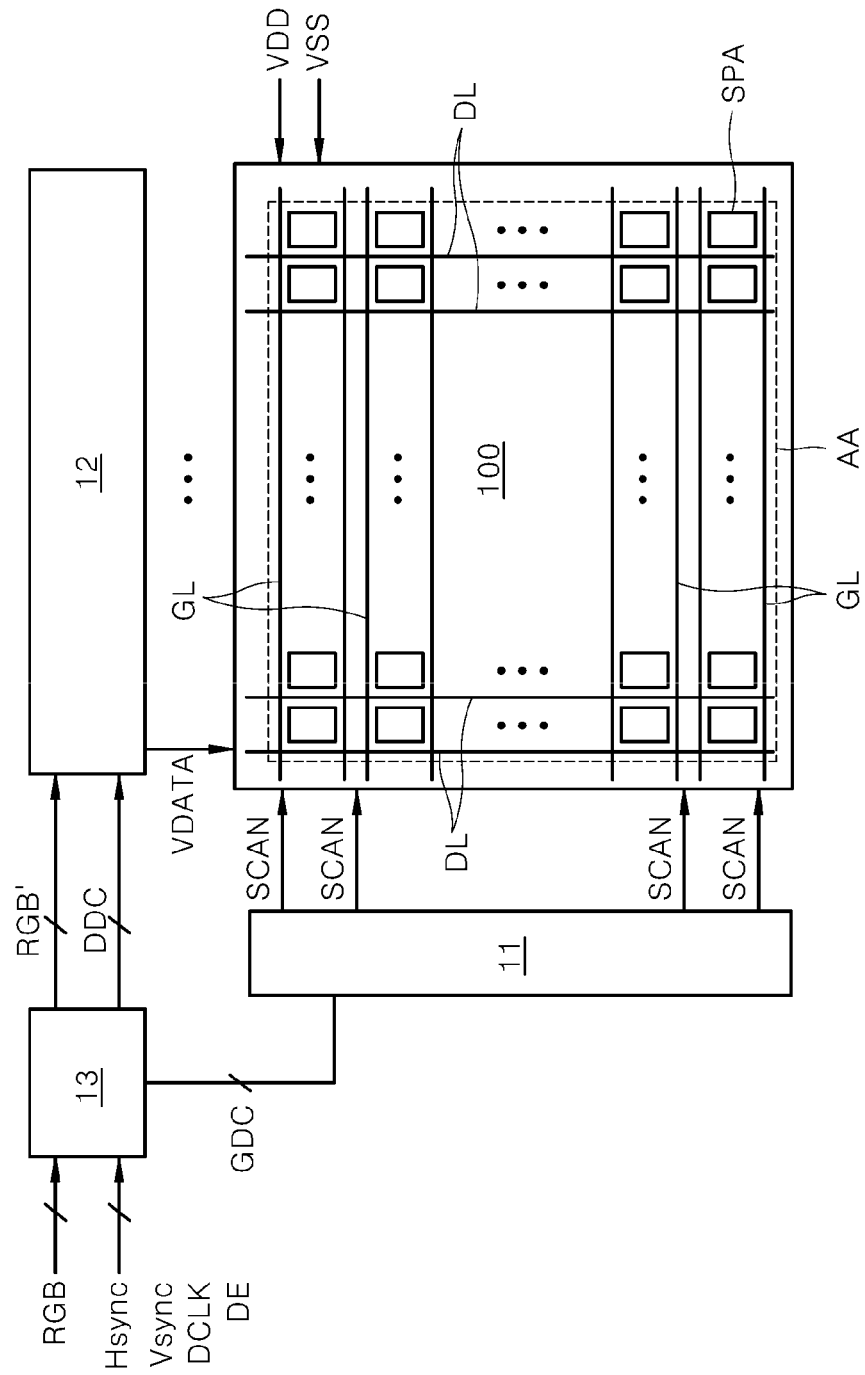
FIG. 2 is a diagram showing a display device according to an embodiment of the present disclosure.

As shown in FIG. 2, a display device 10 includes a display panel 100 including a display area AA, and panel drivers 11, 12, and 13 for supplying driving signals to the display panel 100.

The display panel 100 includes the display area AA in which an image is output, and a plurality of sub-pixel area SPAs arranged in a matrix form in the display area AA for outputting light for displaying an image.

Each of the plurality of sub-pixel area SPAs emits light in a wavelength range corresponding to one of a plurality of different colors. In this connection, a plurality of colors can include red, green, and blue.

The display panel 100 further includes signal lines GL and DL connected to the plurality of sub-pixel area SPAs. The signal lines GL and DL deliver the driving signals of the panel drivers 11, 12, 13 to each sub-pixel area SPA. In one example, the display panel 100 can include a gate line GL supplying a scan signal SCAN and a data line DL supplying a data signal VDATA.

Further, the display panel 100 can further include first and second driving power lines for respectively transmitting first and second driving powers VDD and VSS for driving a light-emissive element corresponding to each sub-pixel area.

The panel drivers of the display device 10 can include a gate driver 11 connected to the gate line GL of the display panel 100, a data driver 12 connected to the data line DL of the display panel 100, and a timing controller 13 for controlling an operation time of each of the gate driver 11 and the data driver 12.

The timing controller 13 rearranges digital video data RGB input from an outside to match a resolution of the display panel 100, and supplies the rearranged digital video data RGB' to the data driver 12.

The timing controller 13 supplies a data control signal DDC to control the operation timing of the data driver 12 and a gate control signal GDC to control the operation timing of the gate driver 11, based on timing signals such as a vertical synchronization signal Vsync, a horizontal synchronization signal Hsync, a dot clock signal DCLK and a data enable signal DE.

The gate driver 11 sequentially supplies a scan signal SCAN to a plurality of gate lines GL for one frame period for displaying an image based on the gate control signal GDC. For example, the gate driver 11 supplies the scan signal SCAN to each gate line GL during each horizontal period corresponding to each gate line GL during one frame period. In this connection, the gate line GL can correspond to sub-pixel area SPAs arranged in a horizontal direction among the plurality of sub-pixel area SPAs.

The data driver 12 converts the rearranged digital video data RGB' into an analog data voltage based on the data control signal DDC. The data driver 12 supplies, to the data line DL, a data signal VDATA corresponding to each of the sub-pixel area SPAs corresponding to each gate line GL during each horizontal period, based on the rearranged digital video data RGB'.

Figure 3:
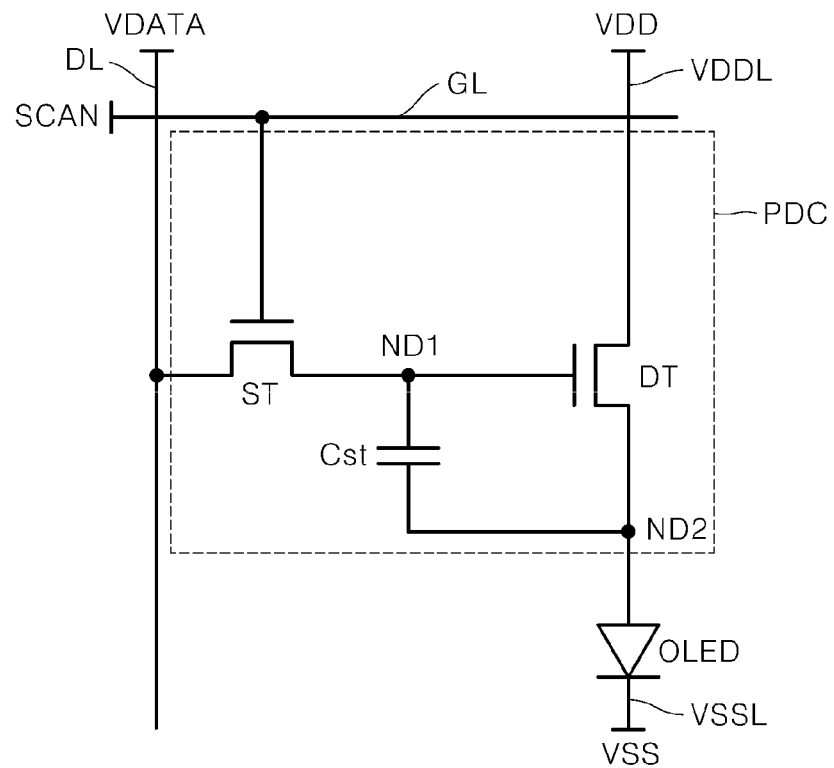
FIG. 3 is an example of an equivalent circuit corresponding to one sub-pixel area of a display area of FIG. 2.

As shown in FIG. 3, each sub-pixel area SPA includes a light-emissive element OLED, and a pixel driving circuit PDC for supplying a driving signal to the light-emissive element OLED.

In one example, the pixel driving circuit PDC can include a driving transistor DT, a switching transistor ST, and a storage Capacitor Cst.

In addition, in FIG. 3, each sub-pixel area SPA further includes a compensation circuit to compensate for deterioration of at least one of the driving thin film transistor DT or the light-emissive element OLED of the pixel driving circuit PDC. The compensation circuit can include at least one transistor to detect the deterioration or to supply a reference power.

The driving transistor DT is connected in series to the light-emissive element OLED and is disposed between the first driving power line VDDL supplying the first driving power VDD and the second driving power line VSSL supplying the second driving power VSS having a lower potential than that of the first driving power VDD.

For example, one end of the driving transistor DT is connected to the first driving power line VDDL, and the other end of the driving transistor DT is connected to one end of the light-emissive element OLED. Further, the other end of the light-emissive element OLED is connected to the second driving power line VSSL.

The switching transistor ST is disposed between the data line DL supplying the data signal VDATA of each sub-pixel area SPA and a gate electrode of the driving transistor DT. The switching transistor ST is turned on based on the scan signal SCAN via the gate line GL.

The storage capacitor Cst is disposed between the gate electrode of the driving transistor DT and the other end of the driving transistor DT. The storage capacitor Cst is disposed between a first node ND1 and a second node ND2. The first node ND1 is a contact point between the gate electrode of the driving transistor DT and the switching transistor ST. The second node ND2 is a contact point between the driving transistor DT and the organic light-emissive element OLED. In this connection, the other end of the driving transistor DT is connected to one end of the light-emissive element OLED.

An operation of the pixel driving circuit PDC is as follows.

The switching transistor ST is turned on based on the scan signal SCAN of the gate line GL. At this time, the data signal VDATA of the data line DL is supplied to the gate electrode of the driving thin film transistor DT and the storage capacitor Cst via the turned-on switching transistor ST.

The storage capacitor Cst is charged with the data signal VDATA.

Further, the driving transistor DT is turned on based on the data signal VDATA and a charged voltage of the storage capacitor Cst to generate a drive current corresponding to the data signal VDATA. Accordingly, the drive current via the turned-on driving transistor DT can be supplied to the light-emissive element OLED.

Next, a description will be given of the display panel 100 of the display device 10 according to an embodiment of the present disclosure.

Figure 4:
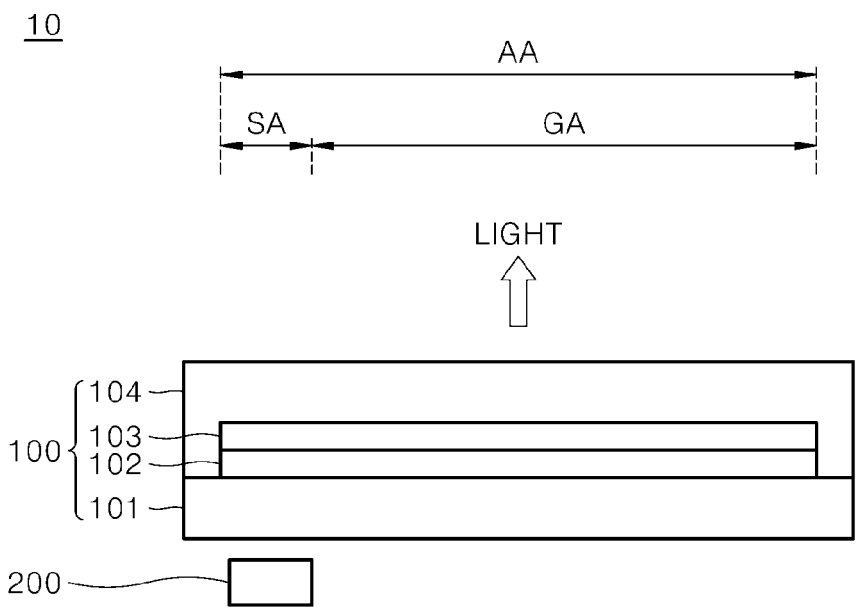
FIG. 4 is a view showing a display panel and an optical sensor in a display device according to an embodiment of the present disclosure.

FIG. 4 is a view showing a display panel and an optical sensor in a display device according to an embodiment of the present disclosure.

As shown in FIG. 4, the display device 10 according to to the embodiment of the present disclosure includes a display panel 100 including a display area AA in which an image is output, and the optical sensor 200 disposed under the display panel 100 and overlapping a portion of the display area AA.

In this connection, the optical sensor 200 is disposed under the display panel 100 in a direction in which the light LIGHT for displaying the image is emitted from the display panel 100.

The display area AA includes the light sensing area SA overlapping the optical sensor 200 disposed under the display panel 100, and the general area GA except for the light sensing area SA.

Further, in each in the light sensing area SA and the general area GA of the display area AA, a plurality of sub-pixel area SPAs outputting light for displaying an image are disposed.

In one example, the display panel 100 can include a support substrate 101 for including the display area AA, a transistor array 102 disposed on a top face of the support substrate 101 and including a pixel driving circuit (PDC in FIG. 3) corresponding to each of the plurality of sub-pixel area SPAs, a light-emissive array 103 disposed on a top face of the transistor array 102 and including a light-emissive element OLED corresponding to each of the plurality of sub-pixel area SPAs, and an encapsulation film 104 bonded to and opposite to the support substrate 101 to seal the light-emissive array 103.

As shown in FIG. 4, the light LIGHT of the light-emissive array 103 for displaying the image is emitted through the encapsulation film 104, and the optical sensor 200 is disposed to face the support substrate 101.

However, this is only an example. Alternatively, in the display device 10 according to an embodiment of the present disclosure, when the light LIGHT of the light-emissive array 103 for displaying an image is emitted through the support substrate 101, the optical sensor 200 can be disposed to face the encapsulation film 104.

Figure 5:
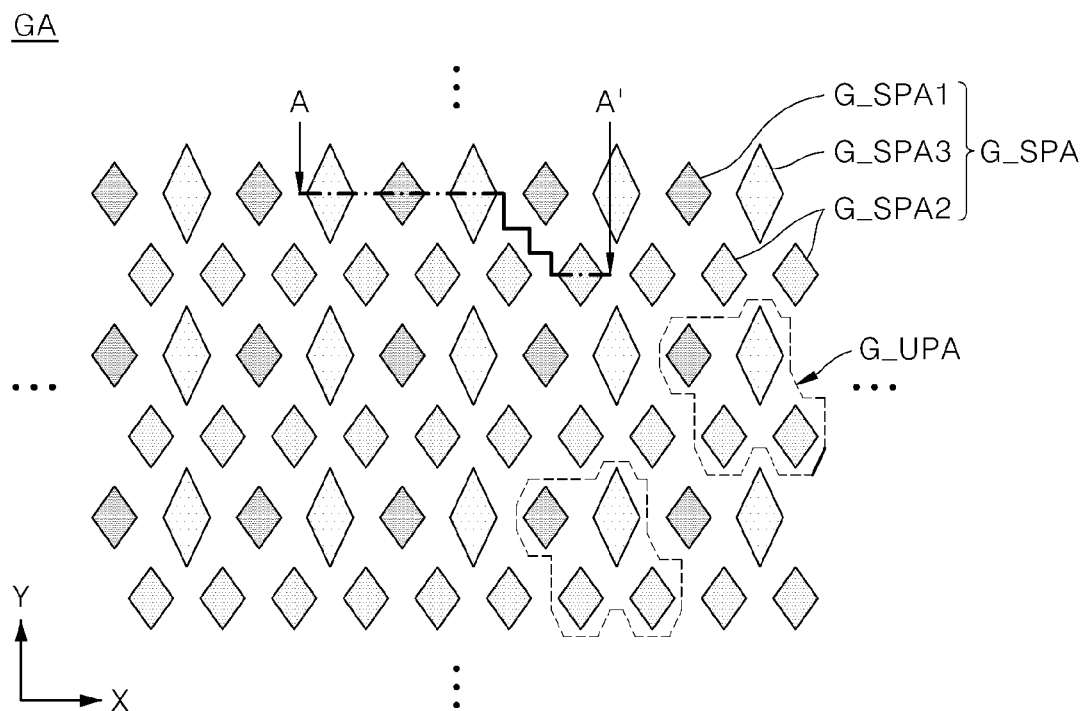
FIG. 5 is a diagram showing an example of a portion of a general area GA of FIG. 4.
Figure 6:
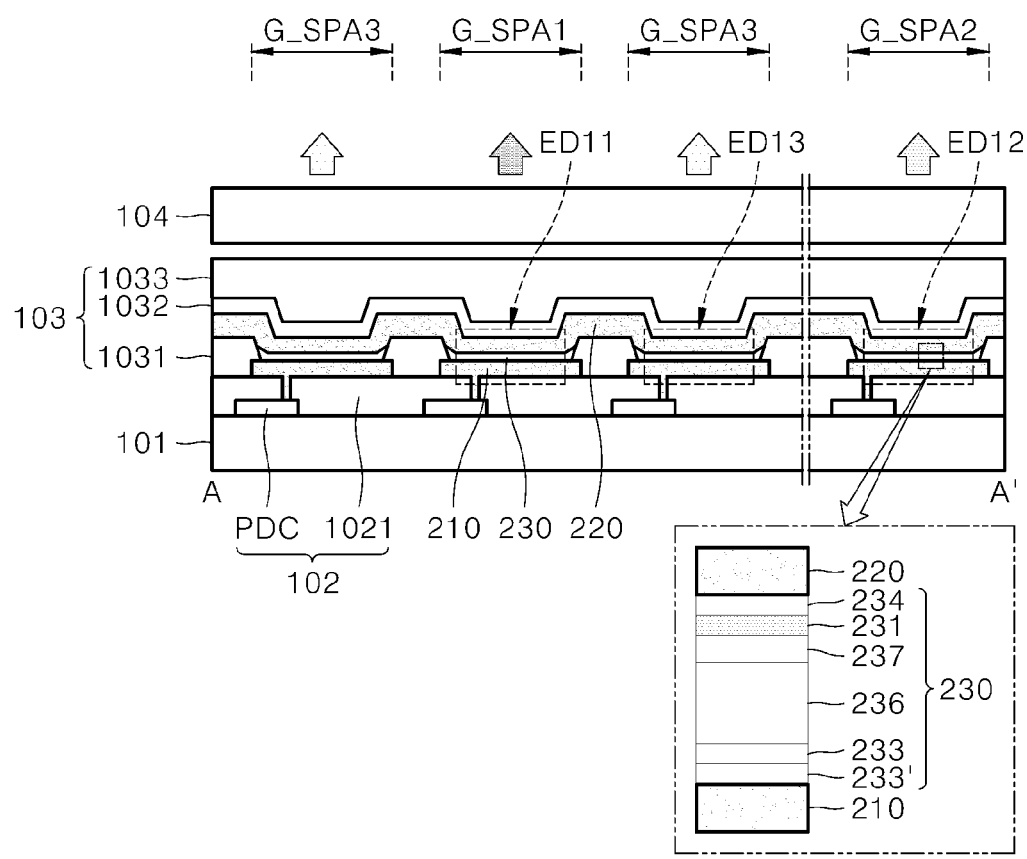
FIG. 6 is a diagram showing along line A-A' in FIG. 5.

FIG. 5 is a diagram showing an example of a portion of the general area of FIG. 4. FIG. 6 is a diagram showing along line A-A' in FIG. 5.

As shown in FIG. 5, in the general area GA of the display area AA that does not overlap with the optical sensor 200, a plurality of sub-pixel areas G_SPA are arranged in parallel with each other.

Each of the plurality of sub-pixel areas G_SPA corresponds to one of first, second, and third colors.

For example, the plurality of sub-pixel areas G_SPA includes a first sub-pixel area G_SPA1 corresponding to the first color, a second sub-pixel area G_SPA2 corresponding to the second color, and a third sub-pixel area G_SPA3 corresponding to the third color.

In this connection, the third color has a wavelength range shorter than that of each of the first and second colors, and the second color has a wavelength range shorter than that of the first color. In one example, the first color can be red RED, the second color can be green GREEN, and the third color can be blue BLUE.

As shown in FIG. 5, the first sub-pixel areas G_SPA1 can be arranged side by side in the Y direction, the second sub-pixel areas G_SPA2 can be arranged side by side in the Y direction, and the third sub-pixel areas G_SPA3 can be arranged side by side in the Y direction.

The first sub-pixel areas G_SPA1 and the third sub-pixel areas G_SPA3 included in the general area GA can be alternately arranged with each other in the X direction.

Further, the second sub-pixel area G_SPA2 included in the general area GA can be arranged in a line in the X direction.

In addition, the first sub-pixel area G_SPA1, the second sub-pixel area G_SPA2, and the third sub-pixel area G_SPA3 adjacent to each other among the plurality of sub-pixel areas G_SPA can constitute an unit pixel area G_UPA which displays various colors via a mixture of the first, second and third colors.

In one example, each unit pixel area G_UPA in the general area GA can be composed of first and third sub-pixel areas G_SPA1 and G_SPA3 that are adjacent to each other in the X direction and two second sub-pixel areas G_SPA2 that are adjacent to each other in the X direction.

Further, in consideration of the luminance characteristics of the light-emissive element of each color and easy rendering of white, a size of each of the first, second and third sub-pixel areas G_SPA1, G_SPA2, and G_SPA3 included in the general area GA can be determined in various ways. In one example, as shown in FIG. 5, the third sub-pixel area G_SPA3 among the first, second and third sub-pixel areas G_SPA1, G_SPA2, and G_SPA3 included in the general area GA can have the largest size. Further, the second sub-pixel area G_SPA2 among the first, second and third sub-pixel areas G_SPA1, G_SPA2, and G_SPA3 included in the general area GA can have the smallest size.

However, the arrangement of the first, second and third sub-pixel areas G_SPA1, G_SPA2, and G_SPA3 in the general area GA shown in FIG. 5 is only an example. Thus, according to an embodiment of the present disclosure, in consideration of the easy implementation of the unit pixel area G_UPA, the arrangement of the first, second and third sub-pixel areas G_SPA1, G_SPA2, and G_SPA3 included in the general area GA can vary in various ways.

As shown in FIG. 6, the display panel 100 according to an embodiment of the present disclosure includes each of general light-emissive elements ED11, ED12, and ED13 corresponding to each of the plurality of sub-pixel areas G_SPA included in the general area GA.

Specifically, the display panel 100 includes the support substrate 101, the transistor array 102 disposed on a top face of the support substrate 101, the light-emissive array 103 disposed on a top face of the transistor array 102, and a sealing layer 104 disposed on a top face of the light-emissive array 103.

The transistor array 102 includes a pixel driving circuit PDC corresponding to each of the plurality of sub-pixel areas G_SPA. In one example, as shown in FIG. 3, the pixel driving circuit PDC can include the switching transistor ST which is turned on and off based on the scan signal of the gate line GL, the driving transistor DT connected to the light-emissive element OLED, the data signal VDATA of the data line DL being transmitted to the gate electrode of the driving transistor DT, and the storage capacitor Cst that is connected to the gate electrode of the driving transistor DT.

Further, the transistor array 102 can further include a planarization film 1021 that covers the pixel driving circuit PDC in a flat manner.

The light-emissive array 103 can be disposed on a top face of the planarization film 1021 of the transistor array 102.

The light-emissive array 103 includes each of general light-emissive elements ED11, ED12, and ED13 corresponding to each of the plurality of sub-pixel areas G_SPA.

Specifically, the light-emissive array 103 can include a first electrode 210 disposed on a top face of the planarization film 1021 and corresponding to each sub-pixel area G_SPA, a bank 1031 disposed on a top face of the planarization film 1021, and corresponding to an outer edge of each sub-pixel area G_SPA and covering an edge of the first electrode 210, a light-emissive structure 230 disposed on a top face of the first electrode 210 and corresponding to each sub-pixel area G_SPA, and a second electrode 220 disposed on a top face of each of the bank 1031 and the light-emissive structure 230.

Further, the light-emissive array 103 can further include a first protective film 1032 covering the second electrode 220 and a second protective film 1033 covering the first protective film 1032 in a flat manner.

FIG. 6 shows each of the first and second protective films 1032 and 1033 as a single layer. This is only an example. Alternatively, at least one of the first and second protective films 1032 and 1033 can be a structure in which two or more insulating layers made of different materials or having different thicknesses are stacked vertically.

Due to these first and second protective films 1032 and 1033, invasion of moisture or oxygen into the light-emissive structure 230 can be suppressed, and thus the influence of foreign substances can be reduced.

Each of the general light-emissive elements ED11, ED12, and ED13 corresponding to the sub-pixel areas G_SPA included in the general area GA includes the first and second electrodes 210 and 220 opposite to each other, and the light-emissive structure 230 interposed between the first and second electrodes 210 and 220. Further, the light-emissive structure 230 of each of the general light-emissive elements ED11, ED12, and ED13 includes a main light-emissive layer 231.

For example, each of the general light-emissive elements ED11, ED12, and ED13 corresponding to each sub-pixel area G_SPA included in the general area GA includes the first and second electrodes 210 and 220 opposite to each other, and the main light-emissive layer 231 interposed between the first and second electrodes 210 and 220.

As mentioned above, the plurality of sub-pixel areas G_SPA1, G_SPA2, and G_SPA3 included in the general area GA includes the first sub-pixel area G_SPA1 corresponding to the first color, the second sub-pixel area G_SPA2 corresponding to the second color, and the third sub-pixel area G_SPA3 corresponding to the third color.

The main light-emissive layer 231 of the first general light-emissive element ED11 corresponding to the first sub-pixel area G_SPA1 in the general area GA can include a first light-emissive material corresponding to the first color. Accordingly, the first general light-emissive element ED11 can emit the first color based on the drive current supplied to the first and second electrodes 210 and 220.

The main light-emissive layer 231 of the second general light-emissive element ED12 corresponding to the second sub-pixel area G_SPA2 in the general area GA can include a second light-emissive material corresponding to the second color. Accordingly, the second general light-emissive element ED12 can emit the second color based on the drive current supplied to the first and second electrodes 210 and 220.

The main light-emissive layer 231 of the third general light-emissive element ED13 corresponding to the third sub-pixel area G_SPA3 in the general area GA can include a third light-emissive material corresponding to the third color. This allows the third general light-emissive element ED13 to emit the third color based on the drive current supplied to the first and second electrodes 210 and 220.

The light-emissive structure 230 of each of the general light-emissive elements ED11, ED12, and ED13 corresponding to each sub-pixel area G_SPA in the general area GA further includes a first hole transport layer 233 disposed between the first electrode 210 and the main light-emissive layer 231, and a first electron transport layer 234 disposed between the second electrode 220 and the main light-emissive layer 231.

The light-emissive structure 230 of each of the general light-emissive elements ED11, ED12, and ED13 can further include a hole injection layer 233' disposed between the first electrode 210 and the first hole transport layer 233.

In addition, the light-emissive structure 230 of each of the general light-emissive elements ED11, ED12, and ED13 further includes a thickness adjustment layer 236 disposed between the first hole transport layer 233 and the main light-emissive layer 231. This thickness adjustment layer 236 will be described in detail hereinafter.

Further, each of the first and second general light-emissive elements ED11 and ED12 respectively disposed in the first and second sub-pixel areas G_SPA1 and G_SPA2 corresponding to the first and second colors having a relatively long wavelength range further includes a color adjustment layer 237 disposed on a bottom face of the main light-emissive layer 231.

Due to the color adjustment layer 237, the light-emissive structure 230 of each of the first and second general light-emissive elements ED11 and ED12 can be formed to have a thickness corresponding to a wavelength range of each of the first and second colors. Accordingly, the luminance of each color can be improved according to the influence of the micro-cavity effect.

In the main light-emissive layer 231 of each of the general light-emissive elements ED11, ED12, and ED13, electrons transferred from the first electron transport layer 234 and holes transferred from the first hole transport layer 233 and the thickness adjustment layer 236 can be combined with each other to form a hole-electron pair to emit the light.

Figure 7:
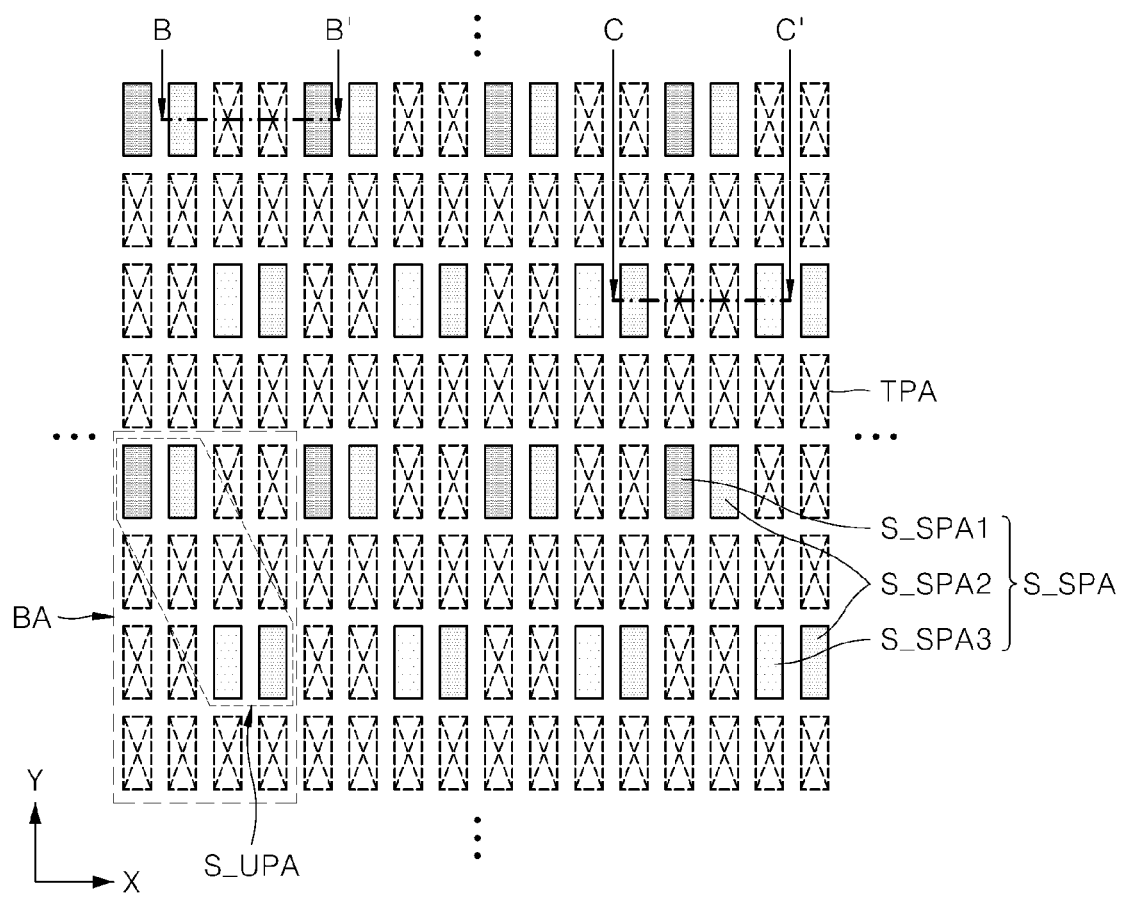
FIGS. 7 and 8 are examples of a portion of a light sensing area SA in FIG. 4.
Figure 8:
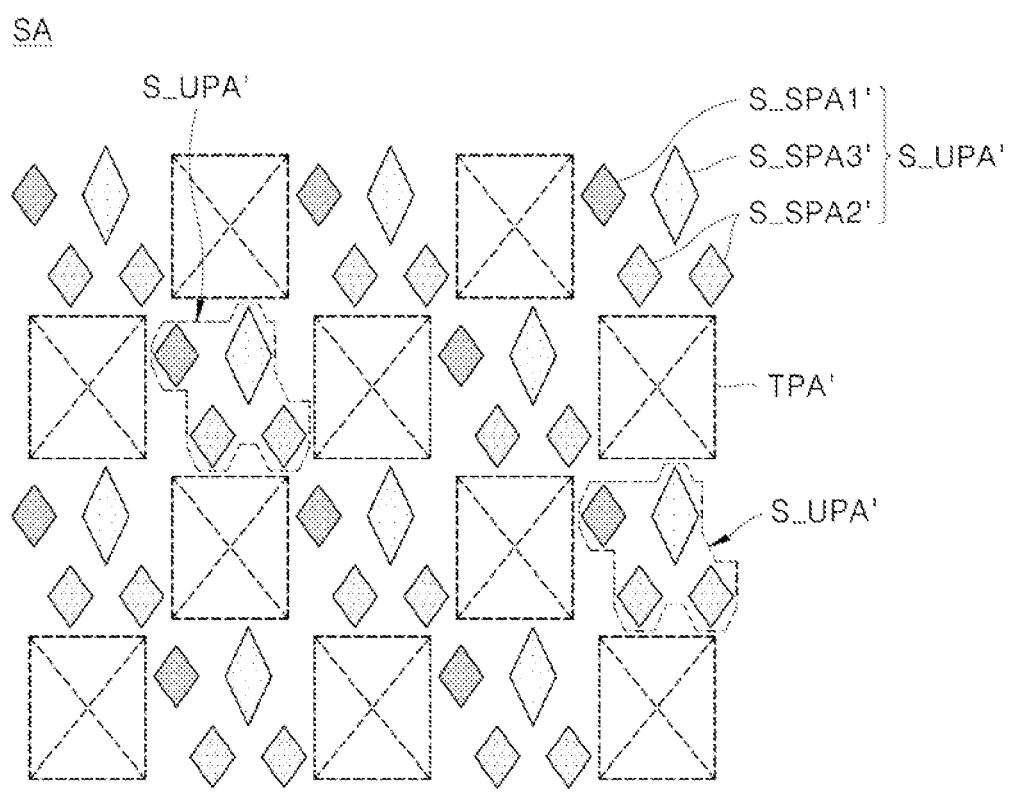
Figure 9:
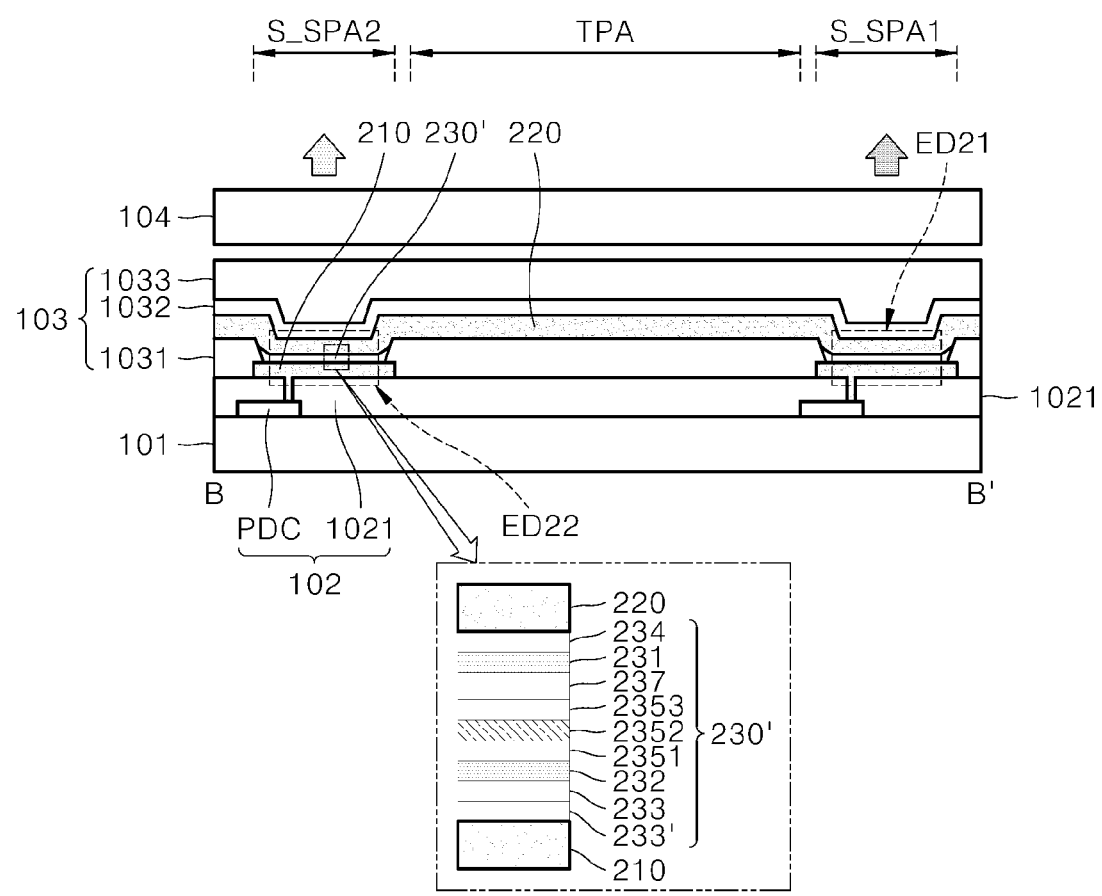
FIG. 9 is a diagram showing along line B-B' in FIG. 7.
Figure 10:
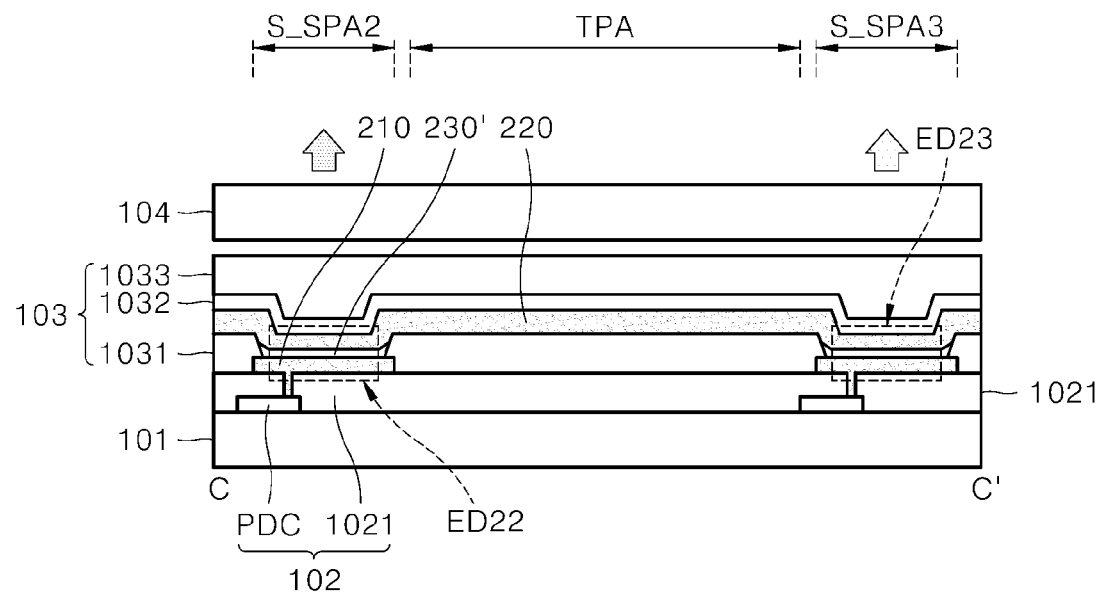
FIG. 10 is a diagram showing along line C-C' in FIG. 7.

FIGS. 7 and 8 are examples of a portion of the light sensing area in FIG. 4. FIG. 9 is a diagram showing along line B-B' in FIG. 7. FIG. 10 is a diagram showing alone line C-C' in FIG. 7.

As shown in FIG. 7, in the light sensing area SA of the display area AA overlapping the optical sensor 200, the plurality of sub-pixel areas S_SPA and the plurality of transmissive pixel areas TPA are alternately arranged with each other.

In one example, assuming that the sub-pixel area S_SPA and the transmissive pixel area TPA in the light sensing area SA have the same size, a row in the X direction (a first horizontal line in FIG. 7) in which first and second sub-pixel areas S_SPA1, S_SPA2 and two transmissive pixel areas TPA are alternately arranged with each other, a row in the X direction (a second horizontal line in FIG. 7) in which only the transmissive pixel areas TPA are arranged, a row in the X direction (a third horizontal line in FIG. 7) in which second and third sub-pixel areas S_SPA2, S_SPA3 and two transmissive pixel areas TPA are alternately arranged with each other, and a row in the X direction (a fourth horizontal line in FIG. 7) in which only the transmissive pixel areas TPA are arranged can be repeatedly arranged in the Y direction. In this connection, the sub-pixel areas S_SPAs arranged in each Y direction column can correspond to the same color and can be spaced apart from each other while three transmissive pixel areas TPA are interposed therebetween.

In this case, the unit pixel area S_UPA that implements each of various colors is composed of first and third sub-pixel areas S_SPA1 and S_SPA3 spaced apart from each other by one transmissive pixel area TPA in a diagonal direction oblique to the X and Y directions, and two second sub-pixel areas S_SPA2 respectively adjacent to the first and third sub-pixel areas S_SPA1 and S_SPA3 in the X direction.

As a result, a reference area BA can be composed of 16 pixel areas U SPA and TPA including the first and third sub-pixel areas S_SPA1, and S_SPA3 and the two second sub-pixel areas S_SPA2, and twelve transmissive pixel areas TPA arranged around the first and third sub-pixel areas S_SPA1, and S_SPA3 and the two second sub-pixel areas S_SPA2. Each unit pixel area S_UPA can be defined in each area BA.

Therefore, assuming that a size of the sub-pixel area S_SPA in the light sensing area SA is twice a size of the sub-pixel area (G_SPA of FIG. 5) in the general area GA, and an aperture ratio in the general area GA is 100%, an aperture ratio in the light sensing area SA can be derived as 50%=(4/16)*2*100%. In this connection, the aperture ratio corresponds to a ratio of an area from which light is emitted to a specific area, for example, a ratio of an area allocated to the sub-pixel areas to the specific area.

In this case, in order to reduce a difference between the visibilities in the light sensing area SA and the general area GA, each of the multi light-emissive elements ED21, ED22, and ED23 arranged in each sub-pixel area S_SPA included in the light sensing area SA should exhibit about two times of a luminance of each of the general light-emissive elements ED11, ED12, and ED13 in the general area GA.

Alternatively, as shown in FIG. 8, each unit pixel area S_UPA' included in the light sensing area SA will be the same as the unit pixel area G_UPA in the general area GA, except that the former is adjacent to surrounding transmissive pixel areas TPA'.

For example, as in general area GA, each unit pixel area S_UPA' in the light sensing area SA can be composed of first and third sub-pixel areas S_SPA1' and S_SPA3' that are adjacent to each other in the X direction, and two second sub-pixel areas S_SPA2' adjacent to first and third sub-pixel areas S_SPA1' and S_SPA3' in the Y direction.

When the aperture ratio in the light sensing area SA is 50%, the transmissive pixel area TPA' in the light sensing area SA can have a size corresponding to a size of the unit pixel area S_UPA', and can be arranged alternately with the unit pixel area S_UPA' in each of the X and Y directions.

However, the arrangement of the sub-pixel area S_SPA and the transmissive pixel area TPA in the light sensing area SA shown in FIGS. 7 and 8 is only an example. Alternatively, according to an embodiment of the present disclosure, considering the aperture ratio in the light sensing area SA and the implementation of the unit pixel areas S_UPA and S_UPA', the arrangement pattern of the sub-pixel area S_SPA and the transmissive pixel area TPA in the light sensing area SA can vary in various ways.

As shown in FIGS. 9 and 10, the display panel 100 according to an embodiment of the present disclosure includes each of multi light-emissive element ED21 ED22, and ED23 corresponding to each of the plurality of sub-pixel areas S_SPA included in the light sensing area SA.

The light sensing area SA of the display panel 100 is the same as the general area GA of the display panel 100, except that in the former includes the multi light-emissive elements ED21, ED22, and ED23. Hereinafter, redundant descriptions are omitted.

Each of the multi light-emissive elements ED21, ED22, and ED23 corresponding to each sub-pixel area S_SPA included in the light sensing area SA can include the first and second electrodes 210 and 220 opposite to each other, and a light-emissive structure 230' disposed between the first and second electrodes 210 and 220. The light-emissive structure 230' includes a main light-emissive layer 231 and an auxiliary light-emissive layer 232.

For example, each of the multi light-emissive elements ED21, ED22, and ED23 corresponding to each sub-pixel area S_SPA included in the light sensing area SA includes the first and second electrodes 210 and 220 opposite to each other, the main light-emissive layer 231 disposed between the first and second electrodes 210 and 220, and the auxiliary light-emissive layer 232 disposed between the first electrode 210 and the main light-emissive layer 231.

In this connection, the auxiliary light-emissive layer 232 includes the same light-emissive material as the main light-emissive layer 231.

Specifically, the plurality of sub-pixel areas S_SPA1, S_SPA2, and S_SPA3 included in the light sensing area SA includes the first sub-pixel area S_SPA1 corresponding to the first color, the second sub-pixel area S_SPA2 corresponding to the second color, and the third sub-pixel area S_SPA3 corresponding to the third color.

Each of the main light-emissive layer 231 and the auxiliary light-emissive layer 232 of the first multi light-emissive element ED21 corresponding to the first sub-pixel area S_SPA1 in the light sensing area SA can include a first light-emissive material corresponding to the first color. Accordingly, the first multi light-emissive element ED21 can emit the first color based on the drive current supplied to the first and second electrodes 210 and 220.

Each of the main light-emissive layer 231 and the auxiliary light-emissive layer 232 of the second multi light-emissive element ED22 corresponding to the second sub-pixel area S_SPA2 in the light sensing area SA must include a second light-emissive material corresponding to the second color. Accordingly, the second multi light-emissive element ED22 can emit the second color based on the drive current supplied to the first and second electrodes 210 and 220.

Each of the main light-emissive layer 231 and the auxiliary light-emissive layer 232 of the third multi light-emissive element ED23 corresponding to the third sub-pixel area S_SPA3 in the light sensing area SA must include the third light-emissive material corresponding to the third color. This allows the third multi light-emissive element ED23 to emit the third color based on the drive current supplied to the first and second electrodes 210 and 220.

As in the light-emissive structure 230 of each of the general light-emissive element ED11, ED12, and ED13, the light-emissive structure 230' of each of the multi light-emissive elements ED21, ED22, and ED23 in the light sensing area SA includes a first hole transport layer 233 disposed between the first electrode 210 and the main light-emissive layer 231, and a first electron transport layer 234 disposed between the second electrode 220 and the main light-emissive layer 231.

The light-emissive structure 230' of each of the multi light-emissive elements ED21, ED22, and ED23 can further include a hole injection layer 233' disposed between the first electrode 210 and the first hole transport layer 233.

The light-emissive structure 230' of each of the multi light-emissive elements ED21, ED22, and ED23 corresponding to each sub-pixel area S_SPA in the light sensing area SA further includes the second electron transport layer 2351, the charge generation layer 2352 and the second hole transport layer 2353 disposed between the auxiliary light-emissive layer 232 and the main light-emissive layer 231.

The charge generation layer 2352 instead of the first electrode 210 supplies holes to the second hole transport layer 2353 adjacent to the main light-emissive layer 231. The charge generation layer 2352 instead of the second electrode 220 supplies electrons to the second electron transport layer 2351 adjacent to the auxiliary light-emissive layer 232.

As in each of the first and second general light-emissive elements ED11 and ED12, each of the first and second multi light-emissive elements ED21 and ED22 corresponding to the first and second sub-pixel areas S_SPA1 and S_SPA2 corresponding to the first and second colors having a relatively long wavelength range further includes a color adjustment layer 237 disposed on a bottom face of the main light-emissive layer 231.

Due to the color adjustment layer 237, the light-emissive structure 230 of each of the first and second multi light-emissive elements ED21 and ED22 can have a thickness corresponding to the wavelength range of each of the first and second colors. As a result, the luminance of each color can be improved according to the influence of the micro-cavity effect.

In the main light-emissive layer 231 of each of the multi light-emissive elements ED21, ED22, and ED23, electrons transferred from the first electron transport layer 234 and holes transferred from the charge generation layer 2352 and the second hole transport layer 2353 can be combined with each other to form an electron-hole pair to emit the light.

Further, in the auxiliary light-emissive layer 232 of each of the multi light-emissive elements ED21, ED22, and ED23, electrons transferred from the charge generation layer 2352 and the second electron transport layer 2351 and the holes transferred from the first hole transport layer 233 can be combined with each other to form an electron-hole pair to emit the light.

Figure 11:
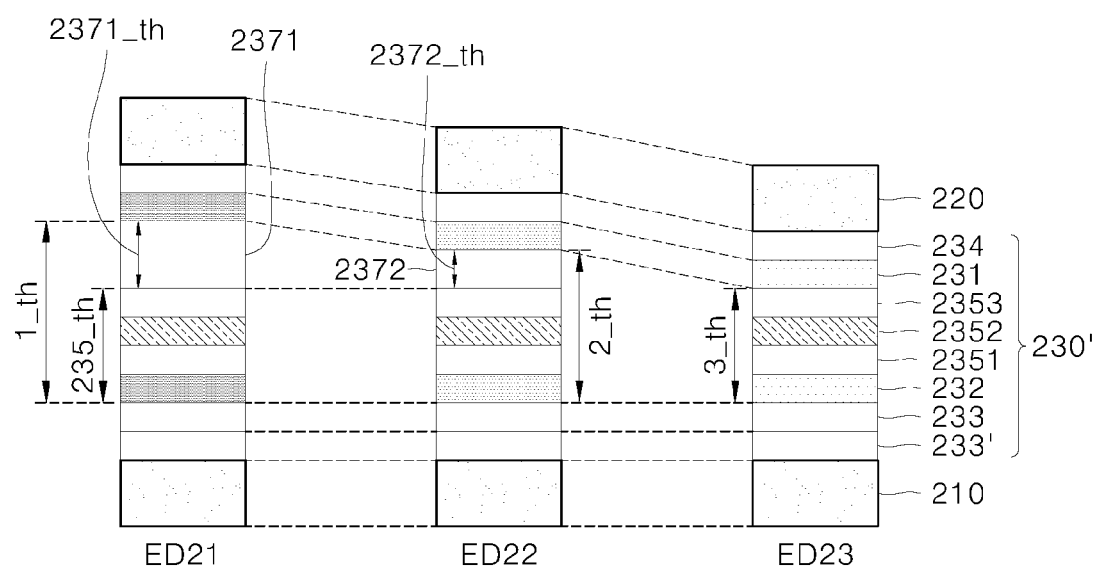
FIG. 11 is a diagram showing a multi light-emissive element corresponding to a sub-pixel area of each color shown in FIGS. 9 and 10.
Figure 12:
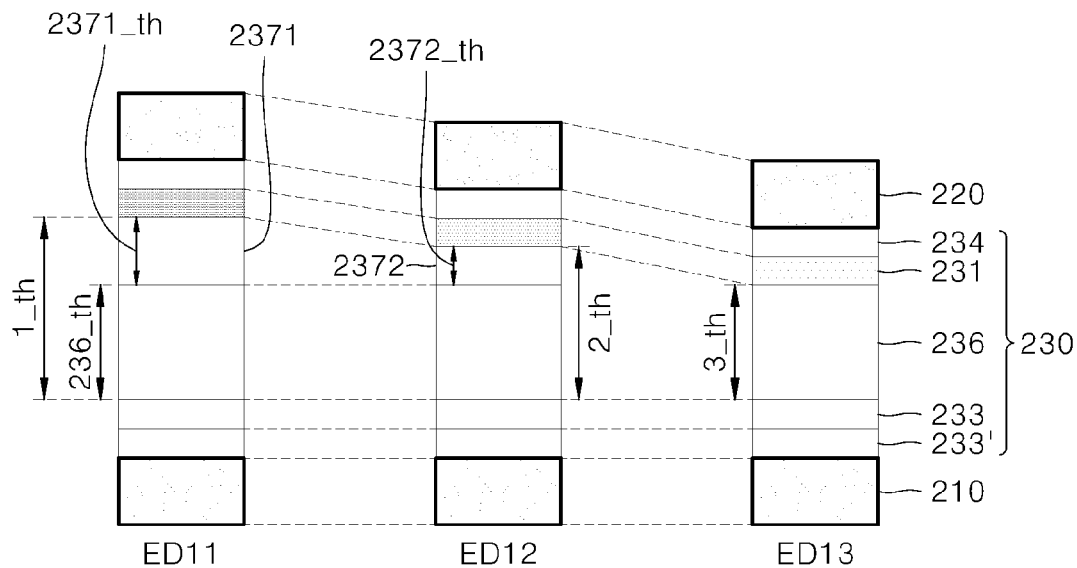
FIG. 12 is a diagram showing a general light-emissive element corresponding to a sub-pixel area of each color shown in FIG. 6.

FIG. 11 is a diagram showing a multi light-emissive element corresponding to a sub-pixel area of each color shown in FIGS. 9 and 10. FIG. 12 is a diagram showing a general light-emissive element corresponding to a sub-pixel area of each color shown in FIG. 6.

As shown in FIG. 11, each of the multi light-emissive elements ED21, ED22 and ED23 corresponding to each sub-pixel area S_SPA in the light sensing area SA can include the first and second electrodes 210 and 220 opposite to each other, the main light-emissive layer 231 disposed between the first and second electrodes 210 and 220, and the auxiliary light-emissive layer 232 disposed between the first electrode 210 and the main light-emissive layer 231. For example, each of the multi light-emissive elements ED21, ED22, and ED23 can have a multi stack structure including the main light-emissive layer 231 and the auxiliary light-emissive layer 232.

In this connection, the main light-emissive layer 231 and the auxiliary light-emissive layer 232 can include the light-emissive material rendering the same color.

For example, the first multi light-emissive element ED21 disposed in the first sub-pixel area S_SPA1 of the first color included in the light sensing area SA can include each of the main light-emissive layer 231 and the auxiliary light-emissive layer 232 which includes a first light-emissive material corresponding to the first color.

The second multi light-emissive element ED22 disposed in the second sub-pixel area S_SPA2 of the second color included in the light sensing area SA includes each of the main light-emissive layer 231 and the auxiliary light-emissive layer 232 which includes a second light-emissive material corresponding to the second color.

The third multi light-emissive element ED23 disposed in the third sub-pixel area S_SPA3 of the third color included in the light sensing area SA includes each of the main light-emissive layer 231 and the auxiliary light-emissive layer 232 which includes a third light-emissive material corresponding to the third color.

Each of the multi light-emissive elements ED21, ED22, and ED23 further includes a first hole transport layer 233 disposed between the first electrode 210 and the auxiliary light-emissive layer 232, and the first electron transport layer 234 disposed between the second electrode 220 and the main light-emissive layer 231.

Further, each of the multi light-emissive elements ED21, ED22, and ED23 has the multi stack structure including the main light-emissive layer 231 and the auxiliary light-emissive layer 232. Thus, each of the multi light-emissive elements ED21, ED22, and ED23 further includes a second electron transport layer 2351, a charge generation layer 2352 and a second hole transport layer 2353 disposed between the auxiliary light-emissive layer 232 and the main light-emissive layer 231. In this connection, the second hole transport layer 2353 is disposed between the charge generation layer 2352 and the main light-emissive layer 231, while the second electron transport layer 2351 is disposed between the charge generation layer 2352 and the auxiliary light-emissive layer 232.

The second electron transport layer 2351 is disposed adjacent to the auxiliary light-emissive layer 232 and transfers electrons to the auxiliary light-emissive layer 232.

The charge generation layer 2352 is disposed between the second electron transport layer 2351 and the second hole transport layer 2353, and transfers electrons to the second electron transport layer 2351 and prevents electrons from moving to the second hole transport layer 2353, and transports holes to the second hole transport layer 2353, and prevents holes from moving to the second electron transport layer 2351.

The second hole transport layer 2353 is disposed adjacent to the main light-emissive layer 231 and transfers holes to the main light-emissive layer 231.

In order to generate a micro-cavity effect corresponding to the wavelength range of each color, each of the first and second multi light-emissive elements ED21 and ED22 corresponding to the first and second sub-pixel areas S_SPA1 and S_SPA2 of the first and second colors having a relatively long wavelength range in the light sensing area SA further includes a color adjustment layer (237 in FIG. 9) disposed on a bottom face of the main light-emissive layer 231.

The color adjustment layer 237 of each of the first and second multi light-emissive elements ED21 and ED22 is disposed between the main light-emissive layer 231 and the second hole transport layer 2353.

Accordingly, the color adjustment layer 237 can be made of a hole transporting material so that the movement of holes transferred from the second hole transport layer 2353 to the main light-emissive layer 231 can be maintained.

In this connection, each of thicknesses 2371_th and 2372_th of the color adjustment layers 237 corresponds to a wavelength range of a color of each of the sub-pixel areas S_SPA1 and S_SPA2.

For example, the first multi light-emissive element ED21 corresponding to the first sub-pixel area S_SPA1 of the first color included in the light sensing area SA includes a first color adjustment layer 2371 having a first thickness 2371_th.

When the second color has a shorter wavelength range than that of the first color, the second multi light-emissive element ED22 corresponding to the second sub-pixel area S_SPA2 of the second color included in the light sensing area SA includes a second color adjustment layer 2372 having a second thickness 2372_th smaller than the first thickness 2371_th.

When the third color has the shortest wavelength range among those of the first to third colors, the third multi light-emissive element ED23 corresponding to the third sub-pixel area S_SPA3 of the third color included in the light sensing area SA does not include the color adjustment layer 237. Accordingly, the main light-emissive layer 231 of the third multi light-emissive element ED23 is in contact with the second hole transport layer 2353.

In one example, as shown in FIG. 12, each of the general light-emissive elements ED11, ED12, and ED13 corresponding to each sub-pixel area G_SPA in the general area GA includes the first and second electrodes 210 and 220 opposite to each other, and the main light-emissive layer 231 disposed between the first and second electrodes 210 and 220.

For example, unlike each of the multi light-emissive elements ED21, ED22, and ED23 in the light sensing area SA, each of the general light-emissive elements ED11, ED12 and ED13 has a single stack structure which does not include the auxiliary light-emissive layer 232, but includes only the main light-emissive layer 231.

In this connection, the main light-emissive layer 231 of each of the general light-emissive elements ED11, ED12, and ED13 includes the same light-emissive layer as the main light-emissive layer 231 of each of the multi light-emissive elements ED21, ED22 and ED23 in the light sensing area SA.

For example, the main light-emissive layer 231 of the first general light-emissive element ED11 disposed in the first sub-pixel area G_SPA1 of the first color included in the general area GA can include a first light-emissive material corresponding to the first color.

The main light-emissive layer 231 of the second general light-emissive element ED12 disposed in the second sub-pixel area G_SPA2 of the second color included in the general area GA can include a second light-emissive material corresponding to the second color.

The main light-emissive layer 231 of the third general light-emissive element ED13 disposed in the third sub-pixel area G_SPA3 of the third color included in the general area GA can include a third light-emissive material corresponding to the third color.

Each of the general light-emissive elements ED11, ED12, and ED13 further includes the first hole transport layer 233 disposed between the first electrode 210 and the main light-emissive layer 231, and the first electron transport layer 234 disposed between the second electrode 220 and the main light-emissive layer 231.

Further, each of the multi light-emissive elements ED21, ED22, and ED23 having a multi stack structure includes the auxiliary light-emissive layer 232, the second electron transport layer 2351, the charge generation layer 2352, and the second hole transport layer 2353 disposed between the first hole transport layer 233 and the main light-emissive layer 231.

However, since each of the general light-emissive elements ED11, ED12, and ED13 has the single stack structure, each of the general light-emissive elements ED11, ED12, and ED13 does not include the auxiliary light-emissive layer 232, the second electron transport layer 2351, the charge generation layer 2352, and the second hole transport layer 2353.

Therefore, when a thickness of the light-emissive structure 230 of each of the general light-emissive elements ED11, ED12, and ED13 is smaller than that of the light-emissive structure 230' of each of the multi light-emissive elements ED21, ED22, ED23, the micro-cavity effects in the general area GA and the light sensing area SA can be different from each other. The luminance characteristic of each of the general light-emissive elements ED11, ED12, and ED13 can be different from that of each of the multi light-emissive elements ED21, ED22, and ED23.

To remove this difference, according to an embodiment of the present disclosure, each of the general light-emissive elements ED11, ED12, and ED13 further include a thickness adjustment layer 236 disposed between the first hole transport layer 233 and the main light-emissive layer 231.

The thickness adjustment layer 236 can be made of a hole transporting material so that the movement of holes transferred from the first hole transport layer 233 to the main light-emissive layer 231 can be maintained.

This thickness adjustment layer 236 is intended to compensate for the difference between the thickness of each of the general light-emissive elements ED11, ED12, and ED13 having the single stack structure and the thickness of each of the multi light-emissive elements ED21, ED22, ED23 having the multi stack structure. Therefore, a thickness 236_th of the thickness adjustment layer 236 corresponds to a total thickness of the components of each of the multi light-emissive elements ED21, ED22 and ED23 which are not included in each of the general light-emissive elements ED11, ED12 and ED13.

For example, the thickness 236_th of the thickness adjustment layer 236 is equal to a sum (235_th in FIG. 11) of a thickness of the auxiliary light-emissive layer 232, a thickness of the second electron transport layer 2351, a thickness of the charge generation layer 2352 and a thickness of the second hole transport layer 2353 included in each of the multi light-emissive elements ED21, ED22, and ED23.

In other words, the thickness 236_th of the thickness adjustment layer 236 is in a range substantially equal to a sum (235_th in FIG. 11) of the thickness of the auxiliary light-emissive layer 232, the thickness of the second electron transport layer 2351, the thickness of the charge generation layer 2352, and the thickness of the second hole transport layer 2353 included in each of the multi light-emissive element ED21, ED22, and ED23. In this connection, the substantially equal range can contain an error that does not cause a difference between the micro-cavity effects thereof.

Further, as in each of the first and second multi light-emissive elements ED21, ED22, each of the first and second general light-emissive elements ED11 and ED12 corresponding to the first and second sub-pixel areas G_SPA1 and G_SPA2 of the first and second colors having a relatively long wavelength range in the general area GA further includes the color adjustment layer (237 in FIG. 6) disposed on a bottom face of the main light-emissive layer 231.

The color adjustment layer 237 of each of the first and second general light-emissive elements ED11 and ED12 is disposed between the main light-emissive layer 231 and the thickness adjustment layer 236.

The color adjustment layer 237 can be made of a hole transporting material.

As in the first multi light-emissive element ED21, the first general light-emissive element ED11 corresponding to the first sub-pixel area G_SPA1 of the first color included in the general area GA includes a first color adjustment layer 2371 having a first thickness 2371_th.

As in the second multi light-emissive element ED22, the second general light-emissive element ED12 corresponding to the second sub-pixel area G_SPA2 of the second color included in the general area GA includes a second color adjustment layer 2372 having a second thickness 2372_th smaller than the first thickness 2371_th.

When the third color has the shortest wavelength range among those of the first to third colors, the third general light-emissive element ED13 corresponding to the third sub-pixel area G_SPA3 of the third color included in the general area GA does not include the color adjustment layer 237. Accordingly, the main light-emissive layer 231 of the third general light-emissive element ED13 is in contact with the thickness adjustment layer 236.

As described above, each of the general light-emissive elements ED11, ED12, and ED13 does not include the auxiliary light-emissive layer 232, the second electron transport layer 2351, the charge generation layer 2352 and the second hole transport layer 2353 of each of the multi light-emissive elements ED21, ED22, ED23 but includes the thickness adjustment layer 236.

Further, each of the first general light-emissive element ED11 and the first multi light-emissive element ED21 corresponding to the first sub-pixel areas G_SPA1 and S_SPA1 includes a color adjustment layer 2371 having the first thickness 2371_th. Thus, a spacing (1_th in FIG. 12) between the first hole transport layer 233 and the main light-emissive layer 231 in the first general light-emissive element ED11 is equal to a spacing (1_th in FIG. 11) between the first hole transport layer 233 and the main light-emissive layer 231 in the first multi light-emissive element ED21.

Similarly, each of the second general light-emissive element ED12 and the second multi light-emissive element ED22 corresponding to the second sub-pixel areas G_SPA2 and S_SPA2 include a color adjustment layer 2372 having the second thickness 2372_th. Therefore, a spacing (2_th in FIG. 12) between the first hole transport layer 233 and the main light-emissive layer 231 in the second general light-emissive element ED12 is equal to a spacing (2_th in FIG. 11) between the first hole transport layer 233 and the main light-emissive layer 231 in the second multi light-emissive element ED22.

Each of the third general light-emissive element ED13 and the third multi light-emissive element ED23 corresponding to the third sub-pixel areas G_SPA3 and S_SPA3 do not include a color adjustment layer. Therefore, a spacing (3_th in FIG. 12) between the first hole transport layer 233 and the main light-emissive layer 231 in the third general light-emissive element ED13 is equal to a spacing (3_th in FIG. 11) between the first hole transport layer 233 and the main light-emissive layer 231 in the third multi light-emissive element ED23.

Thus, even when the light sensing area SA includes the light-emissive element having a structure different from that in the general area GA, the micro-cavity effects in each of the general light-emissive elements ED11, ED12, and ED13 and each of the multi light-emissive elements ED21, ED22, and ED23 can be equal to each other. Thus, a difference between display qualities in the light sensing area SA and the general area GA can be reduced.

In one example, an embodiment of the present disclosure exemplifies that each of the multi light-emissive elements ED21, ED22, and ED23 arranged in the light sensing area SA includes one auxiliary light-emissive layer. However, an embodiment of the present disclosure is not limited thereto. Each of the multi light-emissive elements ED21, ED22, and ED23 can include two or more auxiliary light-emissive layers. In this case, each of the multi light-emissive elements ED21, ED22, and ED23 can further include an electron transport layer, a charge generation layer, and a hole transport layer disposed between the two auxiliary light-emissive layers. Further, the thickness 236_th of the thickness adjustment layer 236 of each of the general light-emissive elements ED11, ED12, and ED13 is equal to a sum of thicknesses of the components of each of the multi light-emissive elements ED21, ED22, and ED23 which are not included in each of the general light-emissive elements ED11, ED12, and ED13.

Figure 13:
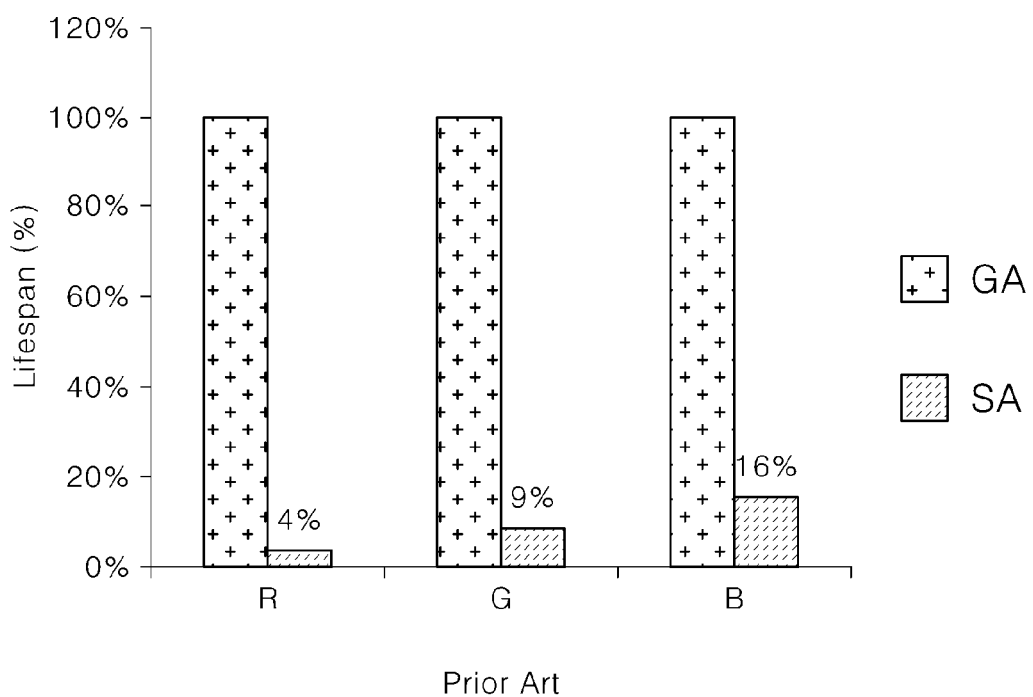
FIG. 13 is a diagram showing a difference between lifespans of a light-emissive element in a light sensing area and a light-emissive element in a general area in a Comparative Example in which the light-emissive element in the light sensing area has the same structure as the light-emissive element in the general area.

FIG. 13 is a diagram showing a difference between lifespans of a light-emissive element in a light sensing area and a light-emissive element in a general area in a Comparative Example in which the light-emissive element in the light sensing area has the same structure as the light-emissive element in the general area.

As mentioned above, the light sensing area SA including the transmissive pixel area TPA has an aperture ratio lower than that in the general area GA. Therefore, in order to prevent the light sensing area SA and the general area GA from being recognized in a different manner from each other, the light-emissive element in the light sensing area SA should emit light at higher luminance than the light-emissive element in the general area GA should.

When the light-emissive element in the light sensing area SA has a single stack structure as the light-emissive element in the general area GA, the lifespan of the light-emissive element in the light sensing area SA is drastically reduced due to the high luminance operation, compared to that of the light-emissive element in the general area GA.

In one example, as shown in FIG. 13, assuming that the lifespan of the light-emissive element in the general area GA is 100%, a lifespan of a light-emissive element R that emits red light is reduced to 4% due to the high luminance operation in the light sensing area SA, that of a light-emissive element G emitting green light is reduced to 9% due to the high luminance operation in the light sensing area SA, and that of a light-emissive element B emitting blue light is reduced to 16% due to high luminance operation in the light sensing area SA.

In this way, when the light-emissive element in the light sensing area SA has a single stack structure as in the light-emissive element in the general area GA, the lifespan of the light-emissive element drops to less than 20% due to the high luminance operation in the light sensing area SA. Thus, a dark spot defect in the light sensing area SA can occur quickly and easily.

Figure 14:
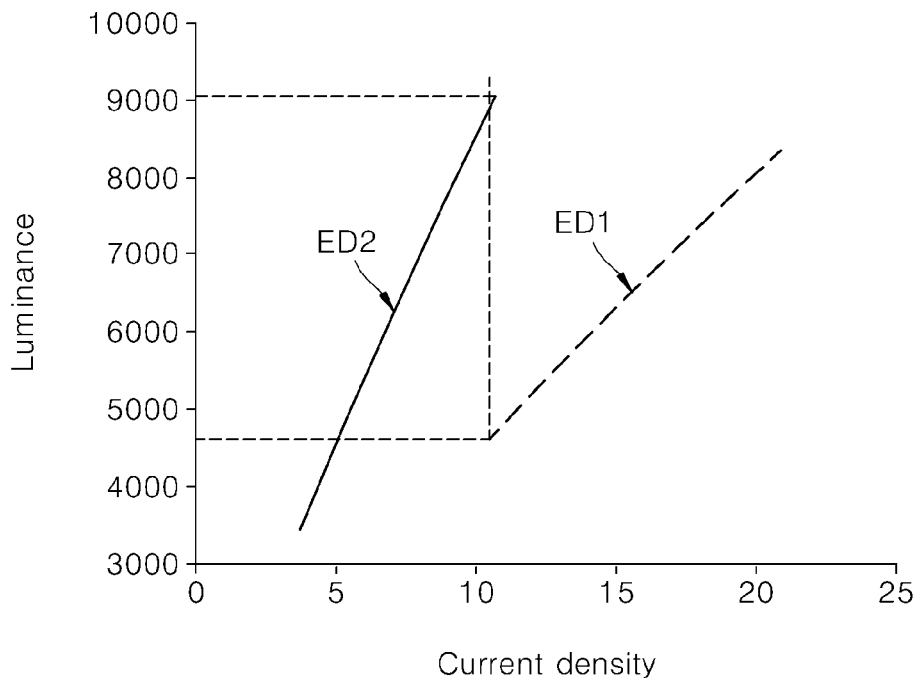
FIG. 14 is a diagram showing driving density and luminance characteristics of each of a general light-emissive element and a multi light-emissive element.

FIG. 14 is a diagram showing current density and luminance characteristics of each of the general light-emissive element and the multi light-emissive element.

According to an embodiment of the present disclosure, the general light-emissive elements ED11, ED12, and ED13, each having a single stack structure, are arranged in the general area GA. The multi light-emissive elements ED21, ED22, and ED23, each having a multi stack structure, are arranged in the light sensing area SA.

Unlike each of the general light-emissive elements ED11, ED12, and ED13, each of the multi light-emissive elements ED21, ED22, and ED23 further includes the auxiliary light-emissive layer 232 and thus can emit light at higher luminance than each of the general light-emissive elements ED11, ED12, and ED13 in predefined current density.

For example, in the predefined current density, the luminance of light emitted from the multi light-emissive element ED2 having the multi stack structure can be higher than the luminance of the light emitted from the general light-emissive element ED1 having the single stack structure.

In one example, as shown in FIG. 14, when the current density is about 10, the luminance of the general light-emissive element ED1 is about 4500 nit, while the luminance of the multi light-emissive element ED2 is about 9000 nit, which is about twice that of the general light-emissive element ED1.

As such, the multi light-emissive element ED2 emits light at higher luminance than the general light-emissive element ED1 emits in a predefined current density. Thus, regardless of the high luminance operation in the light sensing area SA, the lifespan of the multi light-emissive element ED2 can be maintained to be substantially equal to the lifespan of the general light-emissive element ED1.

Figure 15:
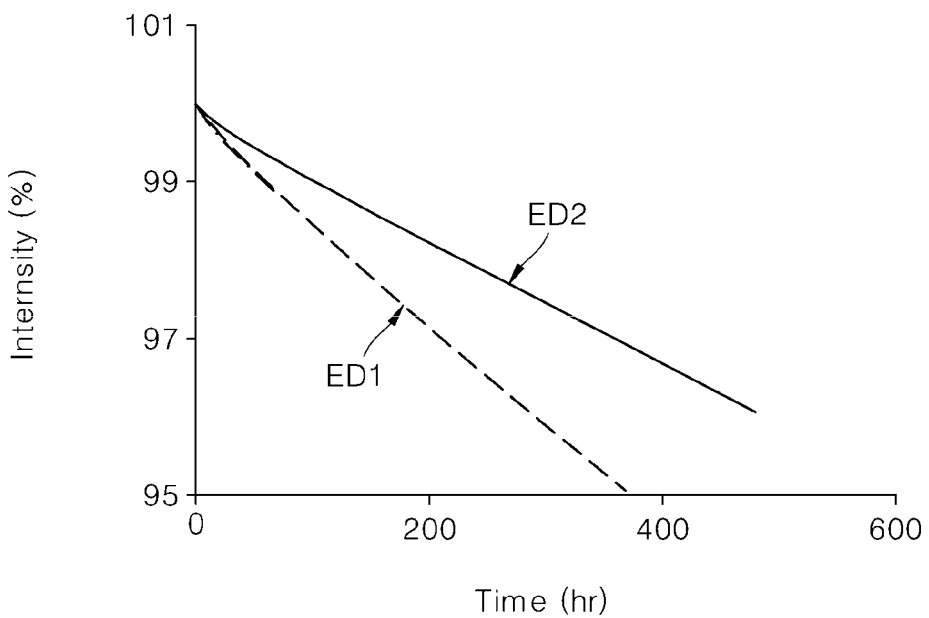
FIG. 15 is a diagram showing lifespan characteristics of each of a general light-emissive element and a multi light-emissive element.

FIG. 15 is a diagram showing the lifespan characteristics of each of a general light-emissive element and a multi light-emissive element.

As shown in FIG. 15, it can be identified that a lifespan reduction slope of the multi light-emissive element ED2 is smaller than that of the general light-emissive element ED1.

For example, the multi light-emissive element ED2 can maintain the high luminance operation for a longer time than the general light-emissive element ED1 may.

As described above, according to an embodiment of the present disclosure, the display area AA includes the light sensing area SA overlapping the optical sensor 200, and the general area GA excluding the light sensing area SA. The display panel 100 includes each of the multi light-emissive elements ED21, ED22, and ED23 corresponding to each sub-pixel area S_SPA in the light sensing area SA and having the multi stack structure including the main light-emissive layer 231 and the auxiliary light-emissive layer 232, and each of the general light-emissive elements ED11, ED12, and ED13 corresponding to each sub-pixel area G_SPA in the general area GA, and having the single stack structure including the main light-emissive layer 231 and not including the auxiliary light-emissive layer 232.

In this connection, the light sensing area SA includes the transmissive pixel area TPA that transmits light to be directed to the optical sensor 200 therethrough, and the plurality of sub-pixel areas S_SPA for displaying an image. Accordingly, the image display function can be implemented in the light sensing area SA. Thus, even when the optical sensor 200 is disposed under the display panel 100, the deformation of an image displayed of the display area AA can be prevented.

Each of the multi light-emissive elements ED21, ED22, and ED23 in the light sensing area SA emits light at higher luminance than each of the general light-emissive elements ED11, ED12, and ED13 in the general area GA emits. Accordingly, the luminance of light emitted from each sub-pixel area S_SPA in the light sensing area SA can be higher than the luminance of light emitted from each sub-pixel area G_SPA in the general area GA. Accordingly, even though the light sensing area SA including the transmissive pixel area TPA has a lower resolution than that in the general area GA, the light sensing area SA can be prevented from being perceived in a darker manner than the general area GA is perceived. Accordingly, deterioration of the image quality of the display panel can be prevented.

Each of the multi light-emissive elements ED21, ED22, and ED23 in the light sensing area SA emits light at higher luminance than each of the general light-emissive elements ED11, ED12, and ED13 emits in a predefined current density. Thus, despite the high luminance operation in the light sensing area SA, the lifespan of each of the multi light-emissive elements ED21, ED22, and ED23 in the light sensing area SA can be prevented from being drastically reduced compared to that of each of the general light-emissive elements ED11, ED12, and ED13 in the general area GA, thereby preventing the dark spot from easily occurring in the light sensing area SA.

Next, a method for manufacturing a display panel according to an embodiment of the present disclosure will be described.

Figure 16:
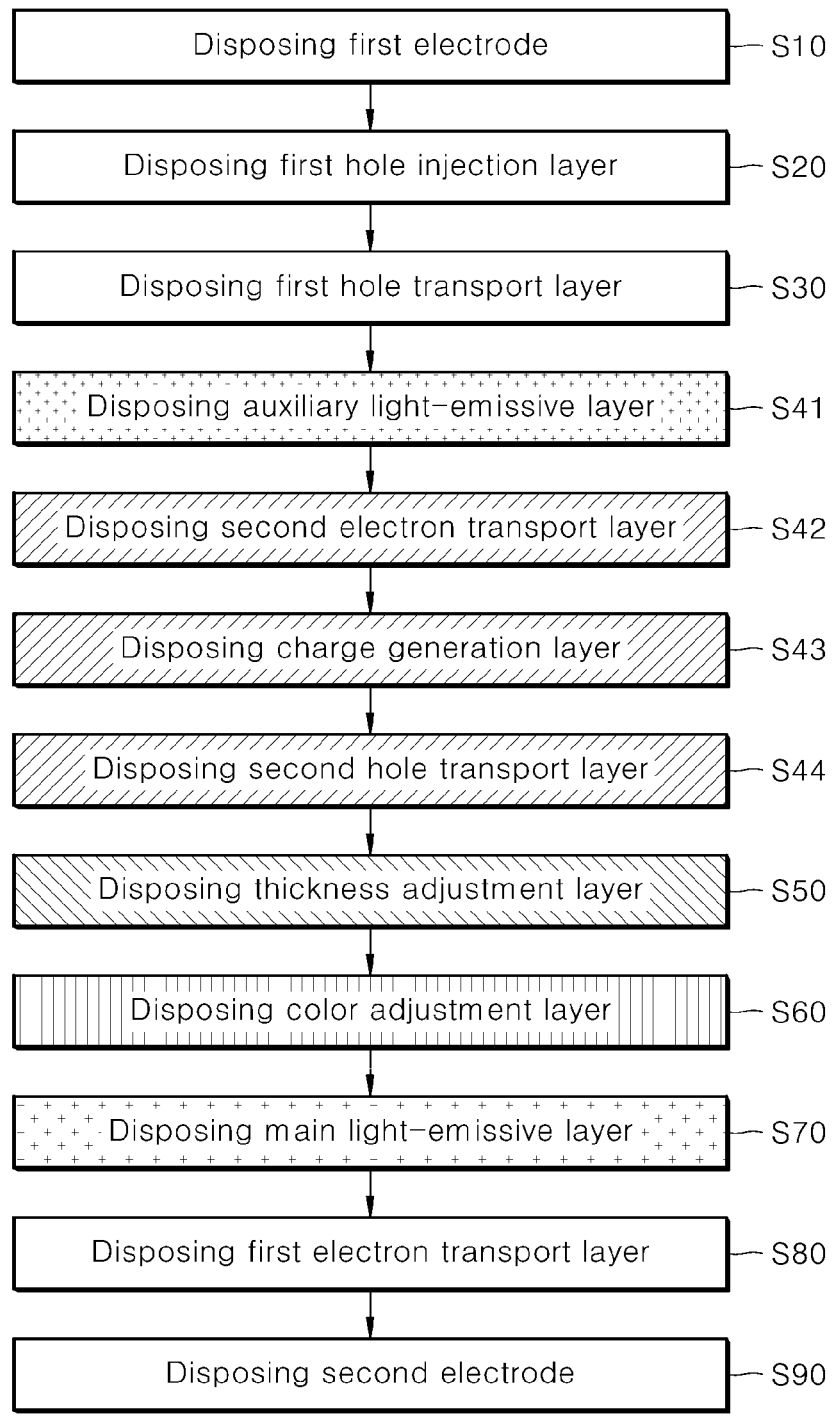
FIG. 16 is a diagram showing a method for manufacturing a display panel according to an embodiment of the present disclosure.

FIG. 16 is a diagram showing a method for manufacturing a display panel according to an embodiment of the present disclosure. FIGS. 17 to 29 are process diagrams showing some steps of the method shown in FIG. 16.

As shown in FIG. 16, a method for manufacturing the display panel 100 according to an embodiment of the present disclosure includes a step S10 of disposing the first electrode 210, a step S20 of disposing the first hole injection layer 233', a step S30 of disposing the first hole transport layer 233, a step S41 of disposing the auxiliary light-emissive layer 232 in the light sensing area SA using a first mask, a step S42 of disposing the second electron transport layer 2351 in the light sensing area SA using a second mask, a step S43 of disposing the charge generation layer 2352 in the light sensing area SA using the second mask, a step S44 of disposing the second hole transport layer 2353 in the light sensing area SA using the second mask, a step S50 of disposing the thickness adjustment layer 236 in the general area GA using a third mask, a step S60 of disposing the color adjustment layer 237 of a partial sub-pixel area corresponding to each of the first and second colors having a relatively long wavelength range using a fourth mask, a step S70 of disposing the main light-emissive layer 231 in the general area GA and the light sensing area SA, a step S80 of disposing the first electron transport layer 234, and a step S90 of disposing the second electrode 220.

Figure 17:
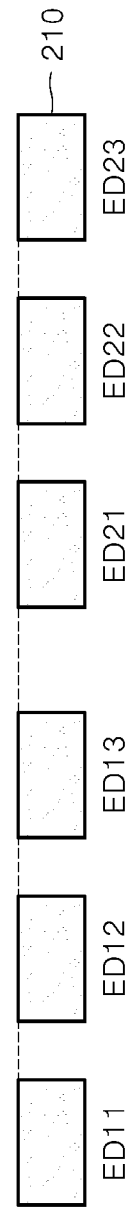
FIGS. 17 to 29 are process diagrams showing some steps of the method shown in FIG. 16.

As shown in FIG. 17, the first electrode 210 corresponding to each of the plurality of sub-pixel areas G_SPA and S_SPA included in the general area GA and the light sensing area SA of the display area AA is disposed (S10).

Referring to FIG. 6, FIG. 9 and FIG. 10, the first electrode 210 can be disposed on a top face of the planarization film 1021 of the transistor array 102.

In one example, the step S10 of disposing the first electrode 210 can include a patterning process of a conductive material film disposed on a top face of the planarization film 1021.

Figure 18:
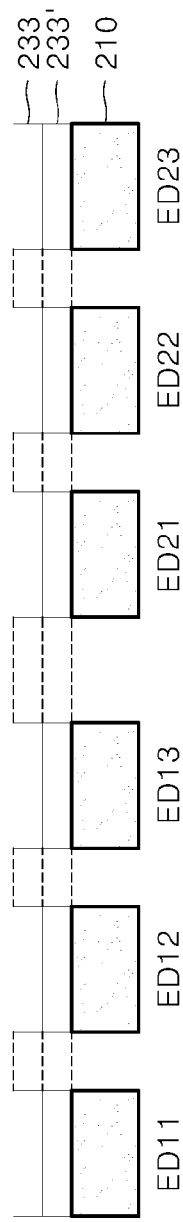

As shown in FIG. 18, the first hole injection layer 233' is disposed on the first electrode 210 (S20) and the first hole transport layer 233 is disposed on the first hole injection layer 233' (S30).

In one example, the step S20 of disposing the first hole injection layer 233' can include a process of stacking the hole-injectable material over the entire display area AA.

Further, the step S30 of disposing the first hole transport layer 233 can include a process of stacking the hole transporting material over the entire display area AA.

Next, the auxiliary light-emissive layer 232 corresponding to each of the sub-pixel areas S_SPA1, S_SPA2, and S_SPA3 included in the light sensing area SA is disposed using each of the first masks M1-1, M1-2, and M1-3 (S41).

Each of the first masks M1-1, M1-2, and M1-3 refers to a member to cover the remaining area of the display area AA except for each of the sub-pixel areas S_SPA1, S_SPA2, and S_SPA3 of each color included in the light sensing area SA. In this connection, each of the first masks M1-1, M1-2, and M1-3 corresponds to each of the three colors.

For example, the first mask M1 include a first mask M1-1 of the first color that selectively opens the first sub-pixel area S_SPA1 included in the light sensing area SA, a first mask M1-2 of the second color that selectively opens the second sub-pixel area S_SPA2 included in the light sensing area SA, and a first mask M1-3 of the third color that selectively opens the third sub-pixel area S_SPA3 included in the light sensing area SA.

Figure 19:
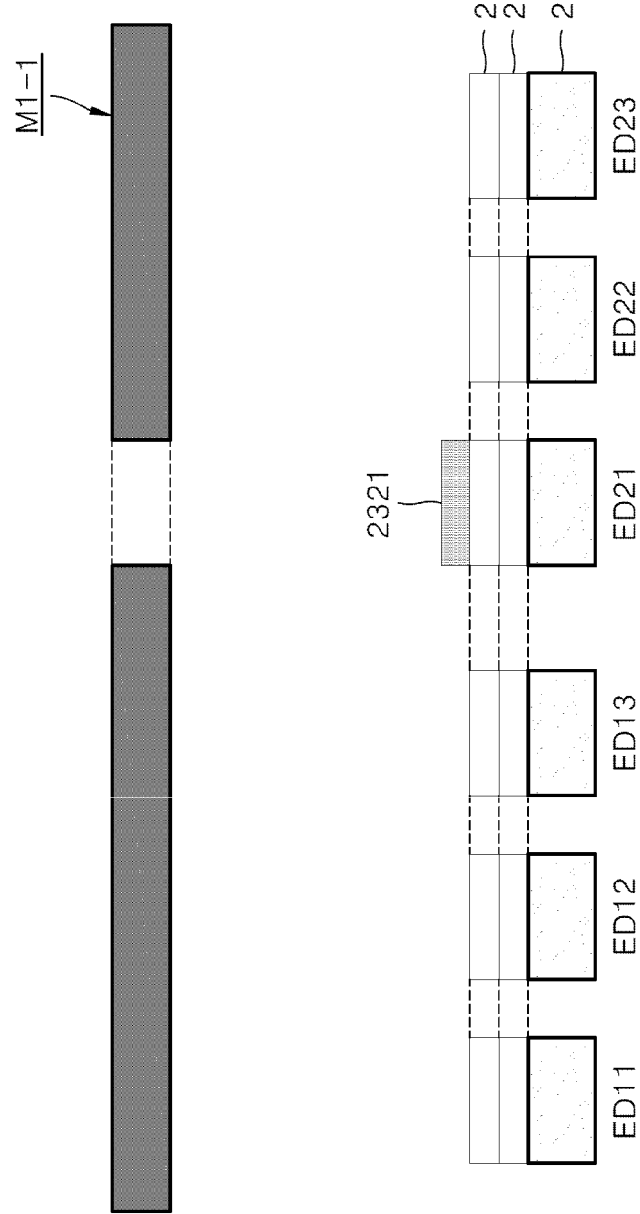

As shown in FIG. 19, via the process of stacking the first light-emissive material corresponding to the first color while the first mask M1-1 of the first color is disposed, the auxiliary light-emissive layer 2321 of the first color corresponding to the first sub-pixel area S_SPA1 in the light sensing area SA is disposed on a top face of the first hole transport layer 233.

Figure 20:
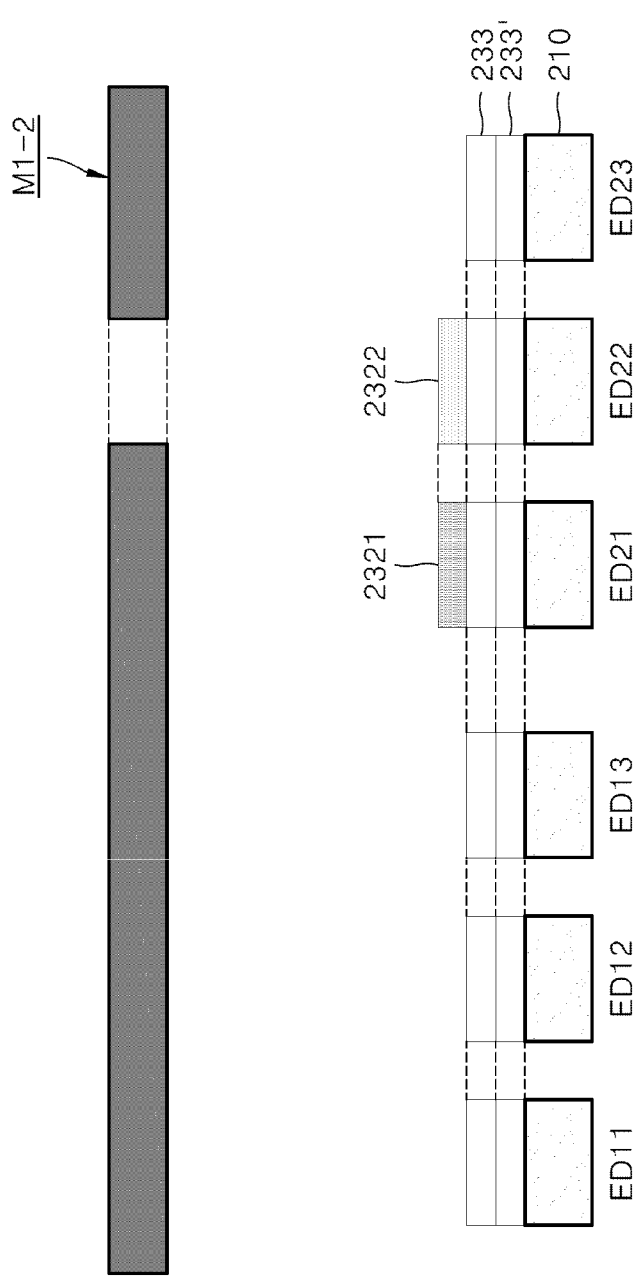

As shown in FIG. 20, via the process of stacking the second light-emissive material corresponding to the second color while the first mask M1-2 of the second color is placed, the auxiliary light-emissive layer 2322 of the second color corresponding to the second sub-pixel area S_SPA2 in the light sensing area SA is disposed on a top face of the first hole transport layer 233.

Figure 21:
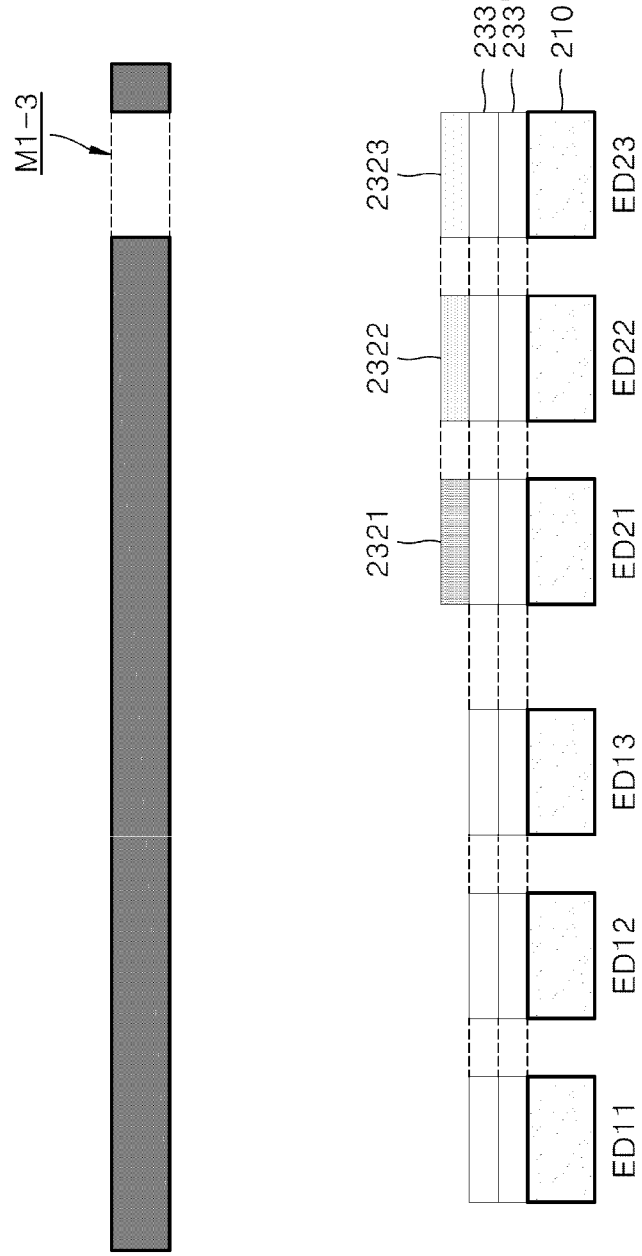

As shown in FIG. 21, via the process of stacking the third light-emissive material corresponding to the third color while the first mask M1-3 of the third color is placed, the auxiliary light-emissive layer 2323 of the third color corresponding to the third sub-pixel area S_SPA3 in the light sensing area SA is disposed on a top face of the first hole transport layer 233.

Figure 22:
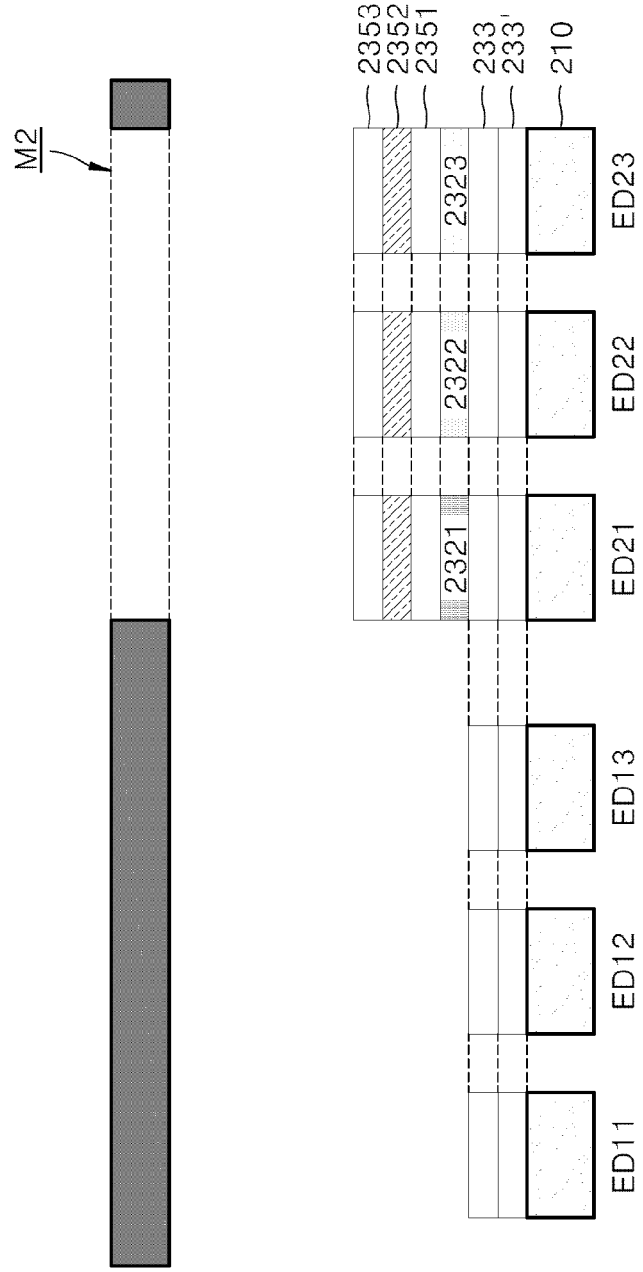

As shown in FIG. 22, the second electron transport layer 2351 corresponding to each sub-pixel area S_SPA included in the light sensing area SA is disposed on a top face of each of the auxiliary light-emissive layers 2321, 2322 and 2323, using a second mask M2 that covers the rest of the display area AA except for the light sensing area SA (S42).

The step S42 of disposing the second electron transport layer 2351 can include a process of stacking an electron transporting material in the light sensing area SA.

Subsequently, using the second mask M2, the charge generation layer 2352 corresponding to each sub-pixel area S_SPA included in the light sensing area SA is disposed on a top face of the second electron transport layer 2351 (S43).

The step S43 of disposing the charge generation layer 2352 can include a process of stacking a material generating electrons in the light sensing area SA, and a process of stacking a material generating holes in the light sensing area SA.

Thereafter, using the second mask M2, the second hole transport layer 2353 corresponding to each sub-pixel area S_SPA included in the light sensing area SA is disposed on a top face of the charge generation layer 2352 (S44).

The step S44 of disposing the second hole transport layer 2353 can include a process of stacking the hole transporting material in the light sensing area SA.

Figure 23:
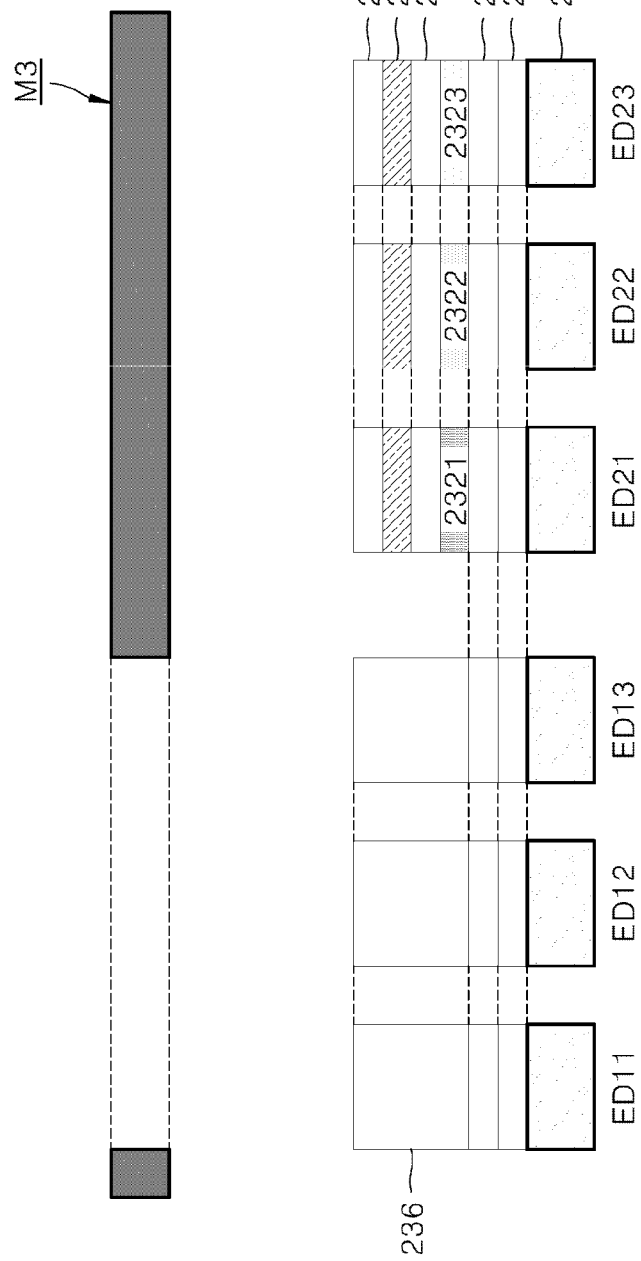

As shown in FIG. 23, the thickness adjustment layer 236 corresponding to each sub-pixel area G_SPA included in the general area GA is disposed on a top face of the first hole transport layer 233 using the third mask M3 that covers the rest of the display area AA except for the general area GA (S50).

The step S50 of disposing the thickness adjustment layer 236 can include a process of stacking the hole transporting material in the general area GA.

Next, the color adjustment layer 237 corresponding to each of the first and second sub-pixel areas G_SPA1, G_SPA2 S_SPA1, and S_SPA2 included in the general area GA and the light sensing area SA is disposed using each of the fourth masks M4-1, M4-2, and M4-3 (S60).

Each of the fourth masks M4-1, M4-2, and M4-3 refers to a member to cover the remaining area of the display area AA except for each of the sub-pixel areas G_SPA1, G_SPA2, G_SPA3, S_SPA1, S_SPA2, and S_SPA3 of each of the colors. In this connection, the fourth masks M4-1, M4-2, and M4-3 correspond to the three colors.

For example, the fourth mask M4 includes a fourth mask M4-1 of the first color that selectively opens each of the first sub-pixel areas G_SPA1 and S_SPA1 included in the general area GA and the light sensing area SA, a fourth mask M4-2 of the second color that selectively opens each of the second sub-pixel areas G_SPA2 and S_SPA2 included in the general area GA and the light sensing area SA, and a fourth mask M4-3 of the third color that selectively opens each of the third sub-pixel areas G_SPA3 and S_SPA3 included in the general area GA and the light sensing area SA.

In this connection, the step S60 of disposing the color adjustment layer 237 can include a process of stacking the hole transporting material in a state in which each of the fourth masks M4-1 and M4-2 is disposed.

Figure 24:
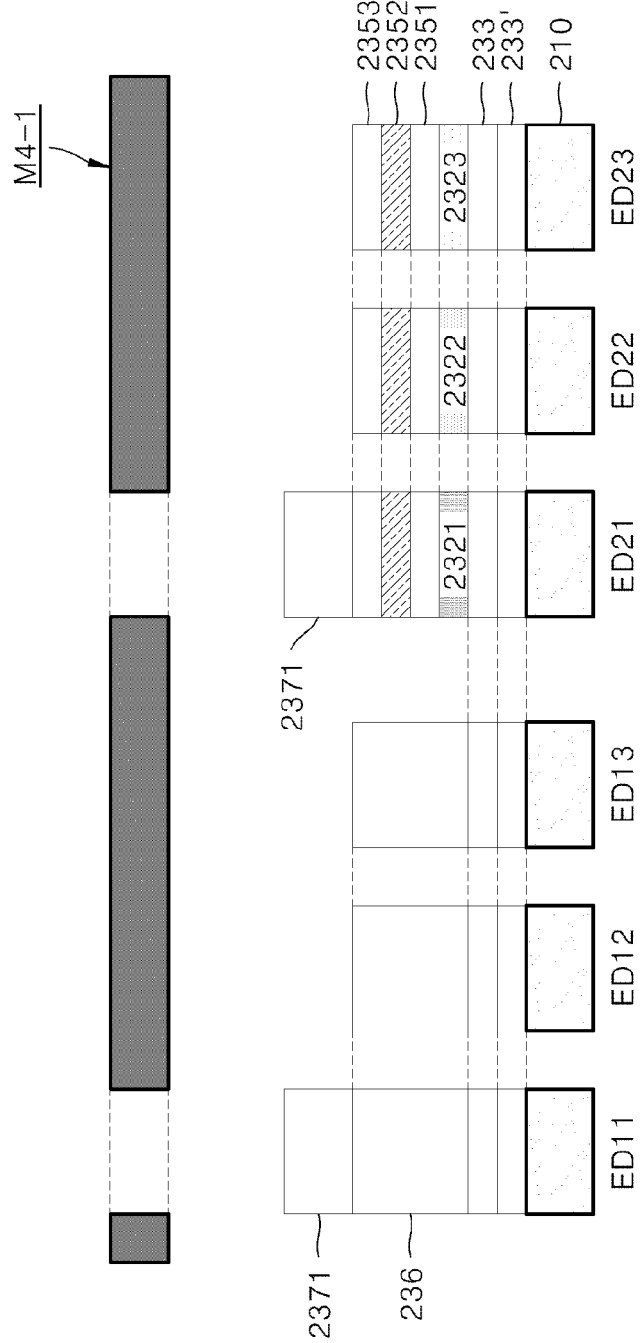

As shown in FIG. 24, the process of stacking the hole transporting material in a state that the fourth mask M4-1 of the first color having a wavelength range longer than that of each of the second and third colors is disposed can be carried out. Thus, the first color adjustment layer 2371 having the first thickness corresponding to each of the first sub-pixel areas G_SPA1 and S_SPA1 in the general area GA and the light sensing area SA can be disposed.

The first color adjustment layer 2371 corresponding to the first sub-pixel area G_SPA1 in the general area GA is disposed on a top face of the thickness adjustment layer 236.

The first color adjustment layer 2371 corresponding to the first sub-pixel area S_SPA1 in the light sensing area SA is disposed on a top face of the second hole transport layer 2353.

Figure 25:
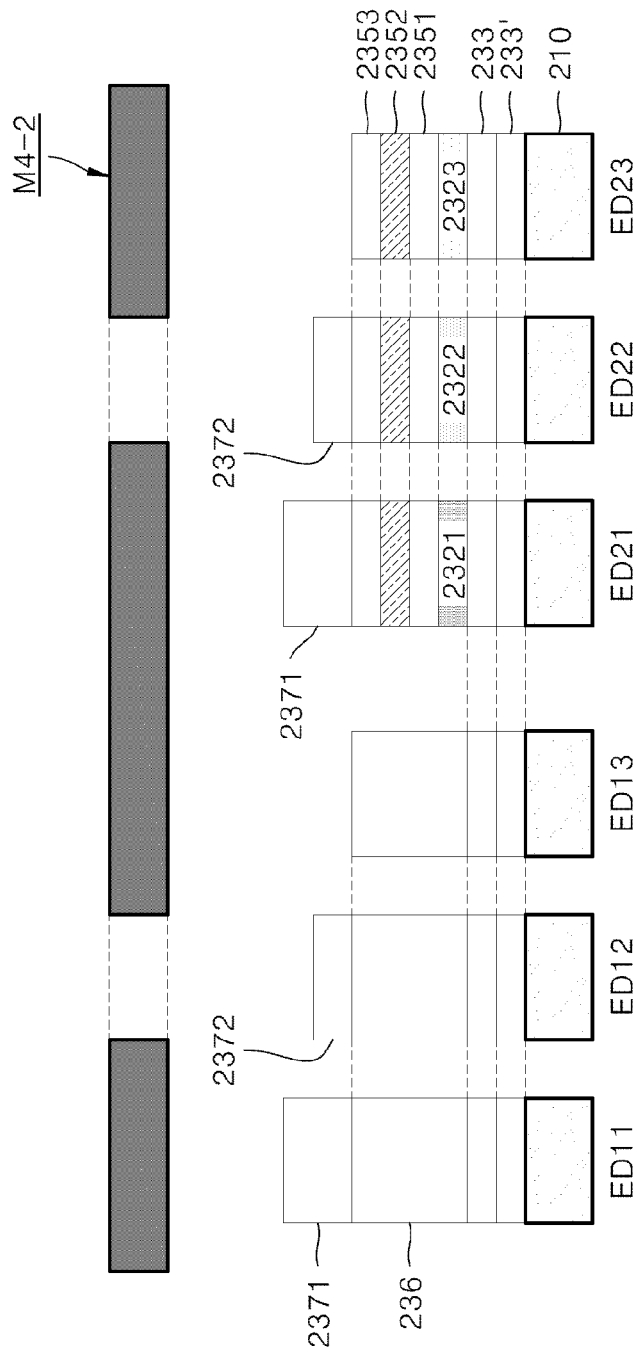

As shown in FIG. 25, the process of stacking the hole transporting material is carried out while the fourth mask M4-2 of the second color having a wavelength range longer than that of the third color is disposed. Thus, the second color adjustment layer 2372 having the second thickness corresponding to each of the second sub-pixel areas G_SPA2 and S_SPA2 in the general area GA and the light sensing area SA is disposed.

The second color adjustment layer 2372 corresponding to the second sub-pixel area G_SPA2 in the general area GA is disposed on a top face of the thickness adjustment layer 236.

The second color adjustment layer 2372 corresponding to the second sub-pixel area S_SPA2 in the light sensing area SA is disposed on a top face of the second hole transport layer 2353.

Next, using each of the fourth masks M4-1, M4-2, and M4-3, the main light-emissive layer 231 corresponding to each of the first, second and third sub-pixel areas G_SPA1, G_SPA2, G_SPA3, S_SPA1, S_SPA2, and S_SPA3 included in the general area GA and the light sensing area SA is disposed (S70).

Figure 26:
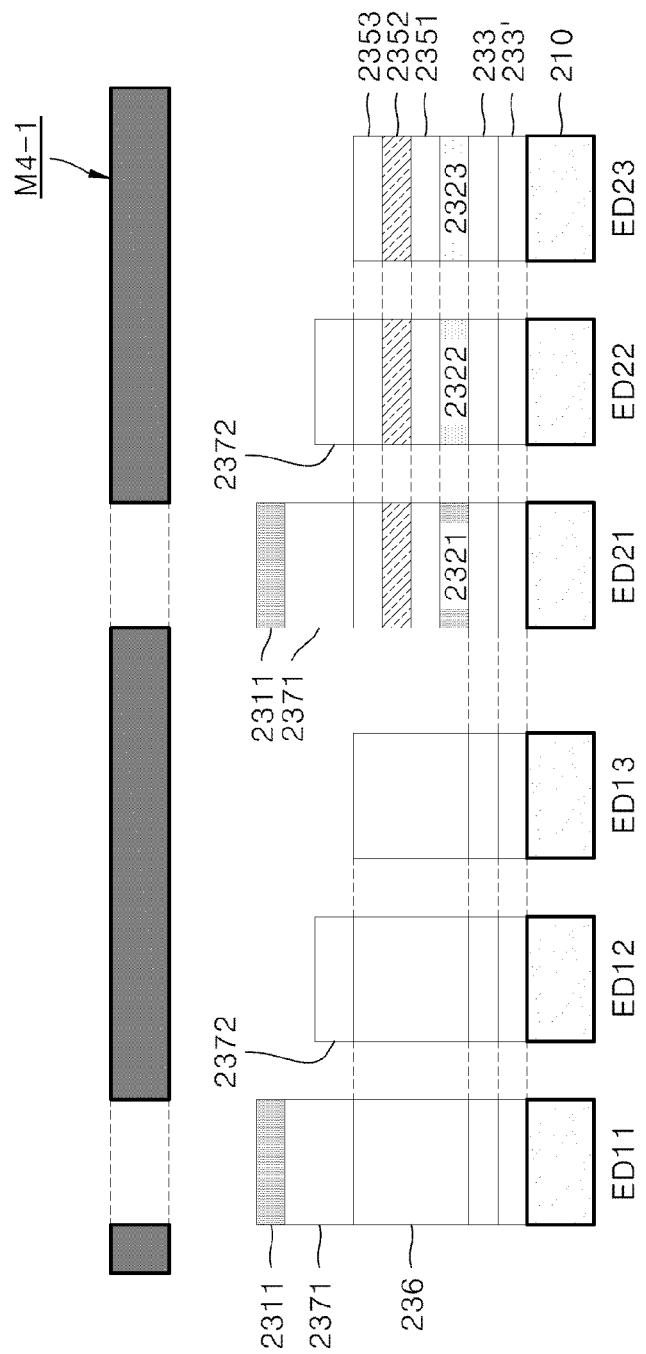

As shown in FIG. 26, via the process of stacking the first light-emissive material while the fourth mask M4-1 of the first color is disposed, the main light-emissive layer 2311 of the first color corresponding to each of the first sub-pixel area G_SPA1 in the general area GA and the first sub-pixel area S_SPA1 in the light sensing area SA is disposed on a top face of the first color adjustment layer 2371.

Figure 27:
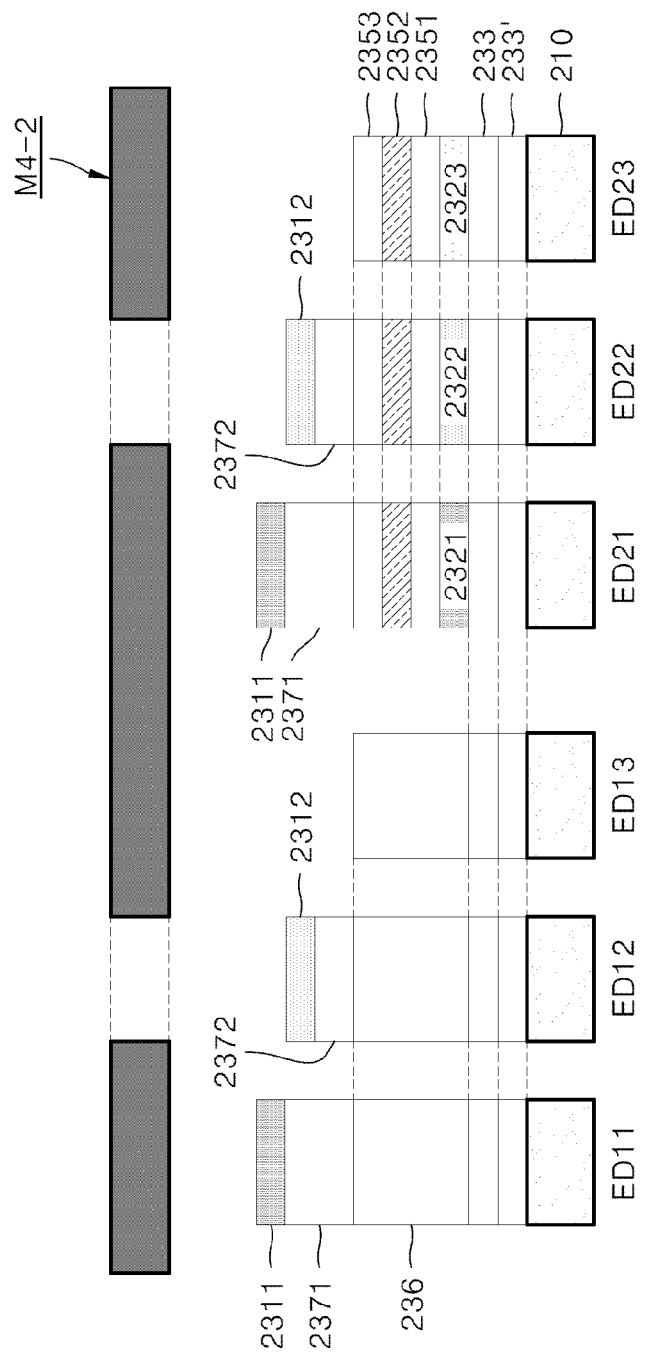

As shown in FIG. 27, via the process of stacking the second light-emissive material while the fourth mask M4-2 of the second color is disposed, the main light-emissive layer 2312 of the second color corresponding to each of the second sub-pixel area G_SPA2 in the general area GA and the second sub-pixel area S_SPA2 in the light sensing area SA is disposed on a top face of the second color adjustment layer 2372.

Figure 28:
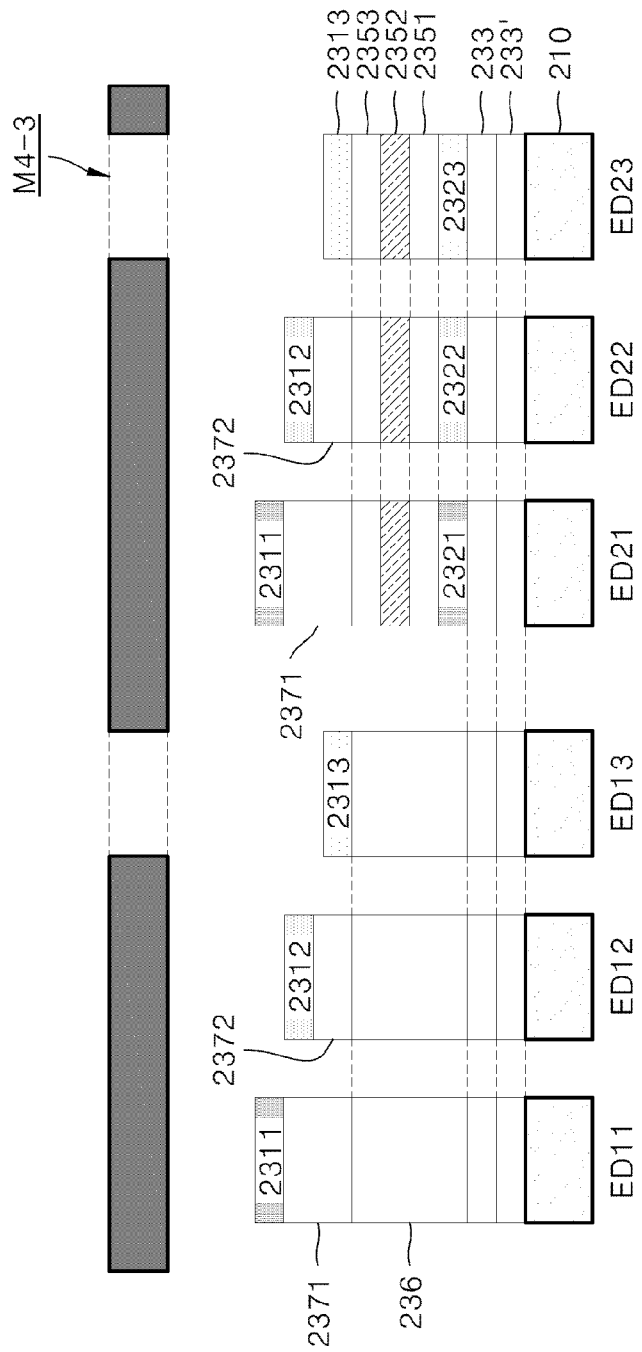

As shown in FIG. 28, via the process of stacking the third light-emissive material while the fourth mask M4-3 of the third color is disposed, the main light-emissive layer 2313 of the third color corresponding to the third sub-pixel area G_SPA3 in the general area GA is disposed on a top face of the thickness adjustment layer 236, and the main light-emissive layer 2313 of the third color corresponding to the third sub-pixel area S_SPA3 in the light sensing area SA is disposed on a top face of the second hole transport layer 2353.

Figure 29:
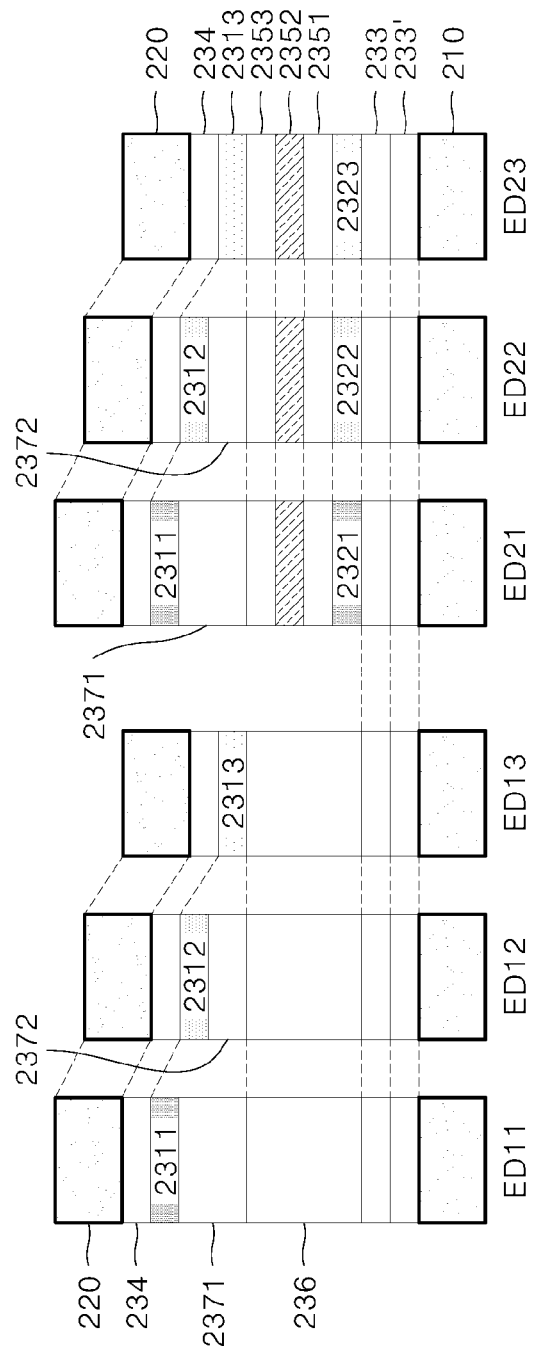

As shown in FIG. 29, the first electron transport layer 234 is disposed on the main light-emissive layer 231 (S80), and the second electrode 220 is disposed on the first electron transport layer 234 (S90).

In one example, the step S80 of disposing the first electron transport layer 234 can include a process of stacking an electron transporting material over the entire display area AA.

Further, the step S90 of disposing the second electrode 220 can include a process of stacking a conductive material film over the entire display area AA.

As described above, the method for manufacturing the display panel according to an embodiment of the present disclosure can perform a selective stacking process using the mask. Thus, each of the general light-emissive elements ED11, ED12, and ED13 can be relatively easily disposed in each sub-pixel area G_SPA in the general area GA, and each of the multi light-emissive elements ED21, ED22, and ED23 having the multi stack structure different from a structure of each of the general light-emissive elements ED11, ED12, and ED13 can be easily disposed in each sub-pixel area S_SPA in the light sensing area SA.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display panel comprising a display area in which an image is capable of being displayed,
wherein a portion of the display area is a light sensing area overlapping an optical sensor, and a remaining portion of the display area other than the light sensing area is a general area,
wherein the display area includes:
a plurality of sub-pixel areas disposed in the general area and the light sensing area for emitting light for displaying the image; and
a plurality of transmissive pixel areas disposed in the light sensing area to transmit the light therethrough, wherein the plurality of transmissive pixel areas are alternately arranged with the sub-pixel areas in the light sensing area, and
wherein the display panel comprises:
a general light-emissive element corresponding to each of the sub-pixel areas in the general area, wherein the general light-emissive element includes a first electrode and a second electrode opposite to each other, and a main light-emissive layer disposed between the first and second electrodes of the general light-emissive element; and
a multi light-emissive element corresponding to each of the sub-pixel areas in the light sensing area, wherein the multi light-emissive element includes a first electrode and a second electrode, a main light-emissive layer, and an auxiliary light-emissive layer disposed between the first electrode and the main light-emissive layer of the multi light-emissive element.

2. The display panel of claim 1, wherein the general light-emissive element further includes:
a first hole transport layer disposed between the first electrode and the main light-emissive layer of the general light-emissive element, and
a first electron transport layer disposed between the second electrode and the main light-emissive layer of the general light-emissive element,
wherein the multi light-emissive element further includes:
a first hole transport layer disposed between the first electrode and the main light-emissive layer of the multi light-emissive element, and
a first electron transport layer disposed between the second electrode and the main light-emissive layer of the multi light-emissive element,
wherein each of the general light-emissive element and the multi light-emissive element further includes:
a hole injection layer disposed between the respective first electrodes and the first hole transport layers of each of the general light-emissive element and the multi light-emissive element, and
wherein the first hole transport layer of the multi light-emissive element is disposed between the first electrode and the auxiliary light-emissive layer thereof.

3. The display panel of claim 2, wherein the multi light-emissive element further includes:
a second electron transport layer, a charge generation layer, and a second hole transport layer disposed between the auxiliary light-emissive layer and the main light-emissive layer of the multi light-emissive element,
wherein the second electron transport layer is disposed adjacent to the auxiliary light-emissive layer, while the charge generation layer is disposed between the second electron transport layer and the second hole transport layer, while the second hole transport layer is disposed adjacent to the main light-emissive layer of the multi light-emissive element, and wherein the charge generation layer, instead of the first electrode of the multi light-emissive element, is capable of supplying holes to the second hole transport layer adjacent to the main light-emissive layer of the multi light-emissive element, and instead of the second electrode of the multi light-emissive element, the charge generation layer is capable of supplying electrons to the second electron transport layer adjacent to the auxiliary light-emissive layer.

4. The display panel of claim 3, wherein the general light-emissive element further includes a thickness adjustment layer disposed between the first hole transport layer and the main light-emissive layer of the general light-emissive element.

5. The display panel of claim 4, wherein the thickness adjustment layer includes a hole transporting material.

6. The display panel of claim 4, wherein a thickness of the thickness adjustment layer is equal to a sum of a thickness of the auxiliary light-emissive layer, a thickness of the second electron transport layer, a thickness of the charge generation layer, and a thickness of the second hole transport layer.

7. The display panel of claim 4, wherein the plurality of sub-pixel areas include:
a first sub-pixel area corresponding to a first color, a second sub-pixel area corresponding to a second color different from the first color, and a third sub-pixel area corresponding to a third color different from the first and second colors,
wherein each of the main light-emissive layer and the auxiliary light-emissive layer of the multi light-emissive element corresponding to the first sub-pixel area includes a first light-emissive material corresponding to the first color,
wherein each of the main light-emissive layer and the auxiliary light-emissive layer of the multi light-emissive element corresponding to the second sub-pixel area includes a second light-emissive material corresponding to the second color, and
wherein each of the main light-emissive layer and the auxiliary light-emissive layer of the multi light-emissive element corresponding to the third sub-pixel area includes a third light-emissive material corresponding to the third color.

8. The display panel of claim 7, wherein the main light-emissive layer of the general light-emissive element corresponding to the first sub-pixel area includes the first light-emissive material,
wherein the main light-emissive layer of the general light-emissive element corresponding to the second sub-pixel area includes the second light-emissive material, and
wherein the main light-emissive layer of the general light-emissive element corresponding to the third sub-pixel area includes the third light-emissive material.

9. The display panel of claim 7, wherein the third color has a wavelength range shorter than a wavelength range of each of the first and second colors,
wherein each of the general light-emissive element and the multi light-emissive element corresponding to the first sub-pixel area further includes:
a color adjustment layer disposed below the respective main light-emissive layer of each of the general light-emissive element and the multi light-emissive element, and
wherein each of the general light-emissive element and the multi light-emissive element corresponding to the second sub-pixel area further includes a color adjustment layer disposed below the respective main light-emissive layer of each of the general light-emissive element and the multi light-emissive element.

10. The display panel of claim 9, wherein the second color has a shorter wavelength range than the wavelength range of the first color,
wherein the color adjustment layer of each of the general light-emissive element and the multi light-emissive element corresponding to the first sub-pixel area has a first thickness, and
wherein the color adjustment layer of each of the general light-emissive element and the multi light-emissive element corresponding to the second sub-pixel area has a second thickness smaller than the first thickness.

11. The display panel of claim 9, wherein the color adjustment layer of the general light-emissive element is disposed between the main light-emissive layer and the thickness adjustment layer of the general light-emissive element, and
wherein the color adjustment layer of the multi light-emissive element is disposed between the main light-emissive layer and the second hole transport layer of the multi light-emissive element.

12. The display panel of claim 9, wherein the main light-emissive layer of the general light-emissive element corresponding to the third sub-pixel area is in contact with the thickness adjustment layer, and
wherein the main light-emissive layer of the multi light-emissive element corresponding to the third sub-pixel area is in contact with the second hole transport layer.

13. The display panel of claim 9, wherein the color adjustment layer includes a hole transporting material.

14. The display panel of claim 9, wherein a spacing between the first hole transport layer and the main light-emissive layer in the general light-emissive element is equal to a spacing between the first hole transport layer and the main light-emissive layer in the multi light-emissive element.

15. A display device comprising:
the display panel according to claim 1; and
a panel driver configured to supply a driving signal to the display panel.

16. A method for manufacturing a display panel, wherein the display panel includes a display area in which an image is capable of being displayed,
wherein a portion of the display area is a light sensing area overlapping an optical sensor, and a remaining portion of the display area other than the light sensing area is a general area,
wherein the display area includes:
a plurality of sub-pixel areas disposed in the general area and the light sensing area for emitting light for displaying the image; and
a plurality of transmissive pixel areas disposed in the light sensing area to transmit the light therethrough,
wherein the plurality of transmissive pixel areas are alternately arranged with the sub-pixel areas in the light sensing area, and
wherein each of the plurality of sub-pixel areas corresponds to one of at least two different colors,
wherein the method comprises:
disposing a first electrode corresponding to each of the plurality of sub-pixel areas;
disposing a first hole injection layer on the first electrode;
disposing a first hole transport layer on the first hole injection layer;

disposing an auxiliary light-emissive layer corresponding to a sub-pixel area of each color on the first hole transport layer in the light sensing area, using a first mask covering a remaining area of the display area excluding the sub-pixel area of each color included in the light sensing area;

sequentially disposing a second electron transport layer, a charge generation layer, and a second hole transport layer on the auxiliary light-emissive layer in the light sensing area, using a second mask covering a remaining area of the display area except for the light sensing area;

disposing a thickness adjustment layer on the first hole transport layer in the general area, using a third mask covering a remaining area of the display area other than the general area;

disposing a main light-emissive layer corresponding to the sub-pixel of each color on the thickness adjustment layer in the general area and the second hole transport layer in the light sensing area, using a fourth mask covering a remaining area of the display area excluding the sub-pixel area of each color;

disposing a first electron transport layer on the main light-emissive layer; and disposing a second electrode on the first electron transport layer.

17. The method of claim 16, wherein in the disposing the thickness adjustment layer, the thickness adjustment layer includes a hole transporting material.

18. The method of claim 16, wherein in the disposing the thickness adjustment layer, a thickness of the thickness adjustment layer is equal to a sum of a thickness of the auxiliary light-emissive layer, a thickness of the second electron transport layer, a thickness of the charge generation layer, and a thickness of the second hole transport layer.

19. The method of claim 16, wherein the plurality of sub-pixel areas include a first sub-pixel area corresponding to a first color, a second sub-pixel area corresponding to a second color different from the first color, and a third sub-pixel area corresponding to a third color different from the first and second colors, and wherein the method further comprises:
before disposing the main light-emissive layer, disposing a color adjustment layer made of a hole transporting material and corresponding to each of the first and second sub-pixel areas using the fourth mask.

20. The method of claim 19, wherein the third color has a shorter wavelength range than a wavelength range of each of the first and second colors, wherein the second color has a shorter wavelength range than a wavelength range of the first color, wherein the fourth mask includes a first sub mask and a second sub mask, and wherein the disposing the color adjustment layer includes:
disposing a color adjustment layer having a first thickness on the thickness adjustment layer in the general area corresponding to the first sub-pixel area and the second hole transport layer in the light sensing area corresponding to the first sub-pixel area, using the first sub mask covering a remaining area of the display area except for the first sub-pixel area; and disposing a color adjustment layer having a second thickness smaller than the first thickness on the thickness adjustment layer in the general area corresponding to the second sub-pixel area and the second hole transport layer in the light sensing area corresponding to the second sub-pixel area, using the second sub mask covering a remaining area of the display area except for the second sub-pixel area.

\* \* \* \* \*